US012250288B2

(12) United States Patent
Horiguti et al.

(10) Patent No.: US 12,250,288 B2
(45) Date of Patent: Mar. 11, 2025

(54) INFORMATION PROCESSING DEVICE, INFORMATION PROCESSING METHOD, AND PROGRAM

(71) Applicant: Sony Semiconductor Solutions Corporation, Kanagawa (JP)

(72) Inventors: Takashi Horiguti, Kanagawa (JP); Yutaka Nakada, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 356 days.

(21) Appl. No.: 17/794,328

(22) PCT Filed: Jan. 18, 2021

(86) PCT No.: PCT/JP2021/001416
§ 371 (c)(1),
(2) Date: Jul. 21, 2022

(87) PCT Pub. No.: WO2021/153301
PCT Pub. Date: Aug. 5, 2021

(65) Prior Publication Data
US 2023/0046212 A1 Feb. 16, 2023

(30) Foreign Application Priority Data

Jan. 31, 2020 (JP) ................. 2020-014934

(51) Int. Cl.
*H04L 69/22* (2022.01)
*H04N 21/434* (2011.01)
*H04N 21/4425* (2011.01)

(52) U.S. Cl.
CPC ......... *H04L 69/22* (2013.01); *H04N 21/4343* (2013.01); *H04N 21/4425* (2013.01)

(58) Field of Classification Search
CPC . H04L 69/22; H04N 21/4343; H04N 21/4425
See application file for complete search history.

(56) References Cited

U.S. PATENT DOCUMENTS

| 7,356,039 | B1 * | 4/2008 | DiMambro | H04L 69/161 |
| | | | | 709/230 |
| 10,666,775 | B1 * | 5/2020 | Volpe | H04L 43/50 |
| 11,032,194 | B2 * | 6/2021 | Hwang | H04L 65/60 |

(Continued)

FOREIGN PATENT DOCUMENTS

| JP | 2010-034971 A | 2/2010 |
| JP | 2019-216368 A | 12/2019 |
| WO | 2017/010315 A1 | 1/2017 |

OTHER PUBLICATIONS

International Search Report (PCT/ISA/210), International Application No. PCT/JP2021/001416, dated Apr. 13, 2021.

*Primary Examiner* — Michael J Moore, Jr.
(74) *Attorney, Agent, or Firm* — Michael Best & Friedrich LLP

(57) ABSTRACT

The present technology relates to an information processing device, an information processing method, and a program that enable appropriate extraction of an ALP packet from a packet of a second packet included in a first packet regardless of a difference in interpretation of a standard.
A payload length obtained on the basis of data of a header of a second packet included in a first packet is corrected.

17 Claims, 25 Drawing Sheets

(56) References Cited

U.S. PATENT DOCUMENTS

| | | | |
|---|---|---|---|
| 11,076,025 B1* | 7/2021 | Volpe | H04L 43/106 |
| 2005/0135261 A1* | 6/2005 | Lee | H04L 1/0072 |
| | | | 370/241 |
| 2008/0059866 A1* | 3/2008 | Song | H04N 21/4346 |
| | | | 714/776 |
| 2016/0127522 A1* | 5/2016 | Yang | H04L 69/22 |
| | | | 370/392 |
| 2016/0134908 A1* | 5/2016 | Kwon | H04N 21/85406 |
| | | | 725/109 |
| 2018/0139650 A1* | 5/2018 | Kwon | H04L 65/40 |
| 2020/0153520 A1* | 5/2020 | Yamagishi | H04N 21/43 |
| 2023/0042613 A1* | 2/2023 | Kotaru | H04N 21/4382 |
| 2023/0046212 A1* | 2/2023 | Horiguti | H04L 65/611 |

* cited by examiner

*FIG. 7*

| Packet_Type Value | Meaning |
|---|---|
| 000 | IPv4 packet |
| 001 | Reserved |
| 010 | Compressed IP packet |
| 011 | Reserved |
| 100 | Link layer signaling packet |
| 101 | Reserved |
| 110 | Packet Type Extension |
| 111 | MPEG-2 Transport Stream |

INFORMATION PROCESSING DEVICE, INFORMATION PROCESSING METHOD, AND PROGRAM

TECHNICAL FIELD

The present technology relates to an information processing device, an information processing method, and a program, and particularly relates to an information processing device, an information processing method, and a program that enable appropriate extraction of a second packet included in a first packet regardless of a difference in interpretation of a standard.

BACKGROUND ART

Patent Document 1 discloses a technique of acquiring a transport stream (TS) packet from a TS signal for digital broadcasting and analyzing a header portion of the TS packet to determine a TS packet having an unallowable value in terms of a standard and detect an abnormality.

CITATION LIST

Patent Document

Patent Document 1: Japanese Patent Application Laid-Open No. 2010-34971

SUMMARY OF THE INVENTION

Problems to be Solved by the Invention

In the Advanced Television Systems Committee (ATSC) 3.0 standard which is one of the next-generation terrestrial broadcasting standards, there have been cases where an ATSC Link-Layer Protocol (ALP) packet having a variable length stored in a Baseband (BB) packet cannot be appropriately extracted due to differences in interpretation of the standard.

The present technology has been made in view of such a situation, and enables appropriate extraction of a second packet included in a first packet regardless of a difference in interpretation of a standard.

Solutions to Problems

An information processing device or a program according to one aspect of the present technology is an information processing device including a processing unit that performs correction on a payload length obtained on the basis of data of headers of second packets included in a first packet, or a program for causing a computer to function as such an information processing device.

An information processing method according to one aspect of the present technology is an information processing method including, in an information processing device having a processing unit, correcting, the processing unit, a payload length obtained on the basis of data of headers of second packets included in a first packet.

In the information processing device, the information processing method, and the program according to one aspect of the present technology, the payload length obtained on the basis of the data of the headers of the second packets included in the first packet is corrected.

BRIEF DESCRIPTION OF DRAWINGS

FIG. 7 is a diagram illustrating a value (Packet_Type Value) of a packet type of the ALP packet and a meaning (Meaning) of the packet type of each value.

MODE FOR CARRYING OUT THE INVENTION

Hereinafter, embodiments of the present technology will be described with reference to the drawings.

<Configuration Example of Transmission System>

Figure 1:
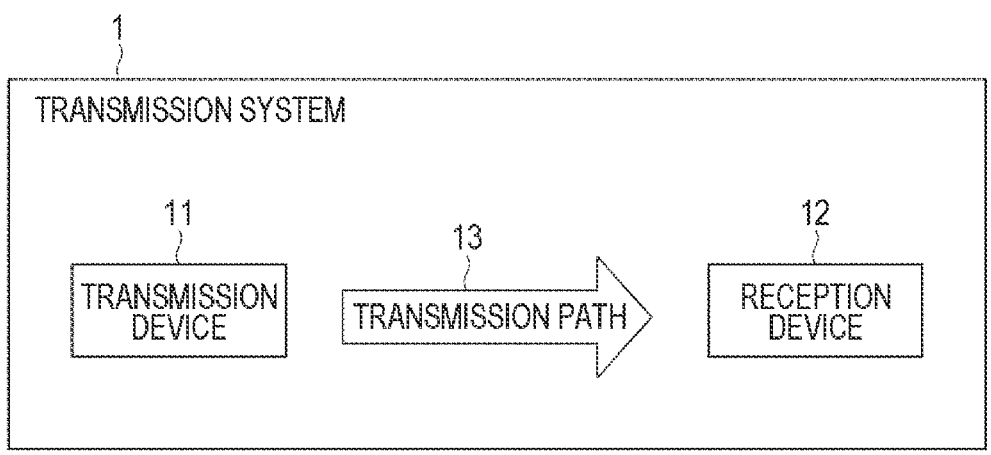
FIG. 1 is a diagram illustrating a configuration of one embodiment of a transmission system to which the present technology is applied.

FIG. 1 is a diagram illustrating a configuration of one embodiment of a transmission system to which the present technology is applied. Note that the system is a logical collection of a plurality of devices.

In FIG. 1, a transmission system 1 includes a transmission device 11 and a reception device 12. In the transmission system 1, data transmission conforming to a digital broadcasting standard such as ATSC 3.0 is performed.

Note that ATSC 3.0, which is one of the next generation terrestrial broadcast standards, employs a method of using a UDP/IP packet, that is, an Internet protocol (IP) packet including a user datagram protocol (UDP) packet for data transmission.

The transmission device 11 transmits content via the transmission path 13. For example, the transmission device 11 transmits a broadcast stream including (components of) video, audio, and the like constituting content such as a broadcast program and signaling as a broadcast wave via the transmission path 13.

The reception device 12 receives and outputs content transmitted from the transmission device 11 via the transmission path 13. For example, the reception device 12 receives the broadcast wave from the transmission device 11, acquires (components of) video, audio, and the like constituting content and signaling from the broadcast stream, and reproduces video and audio of the content such as a broadcast program.

Note that, although only one reception device 12 is illustrated in the transmission system 1 in FIG. 1 for the sake of simplicity of description, a plurality of reception devices 12 can be provided, and broadcast waves transmitted (simultaneously broadcasted) by the transmission device 11 can be simultaneously received by the plurality of reception devices 12 via the transmission path 13.

Furthermore, in the transmission system 1 in FIG. 1, a plurality of transmission devices 11 can also be provided. Each of the plurality of transmission devices 11 can transmit the broadcast wave including the broadcast stream in, for example, a separate frequency band as a separate channel, and the reception device 12 can select a channel for receiving the broadcast stream from among respective channels of the plurality of transmission devices 11.

Moreover, is the transmission system 1 in FIG. 1, the transmission path 13 may be, for example, a transmission path of satellite broadcasting using a broadcasting satellite (BS) or a communications satellite (CS), cable broadcasting (CATV) using a cable, or the like, in addition to terrestrial waves (terrestrial broadcasting).

<Configuration Example of Transmission Device 11>

Figure 2:
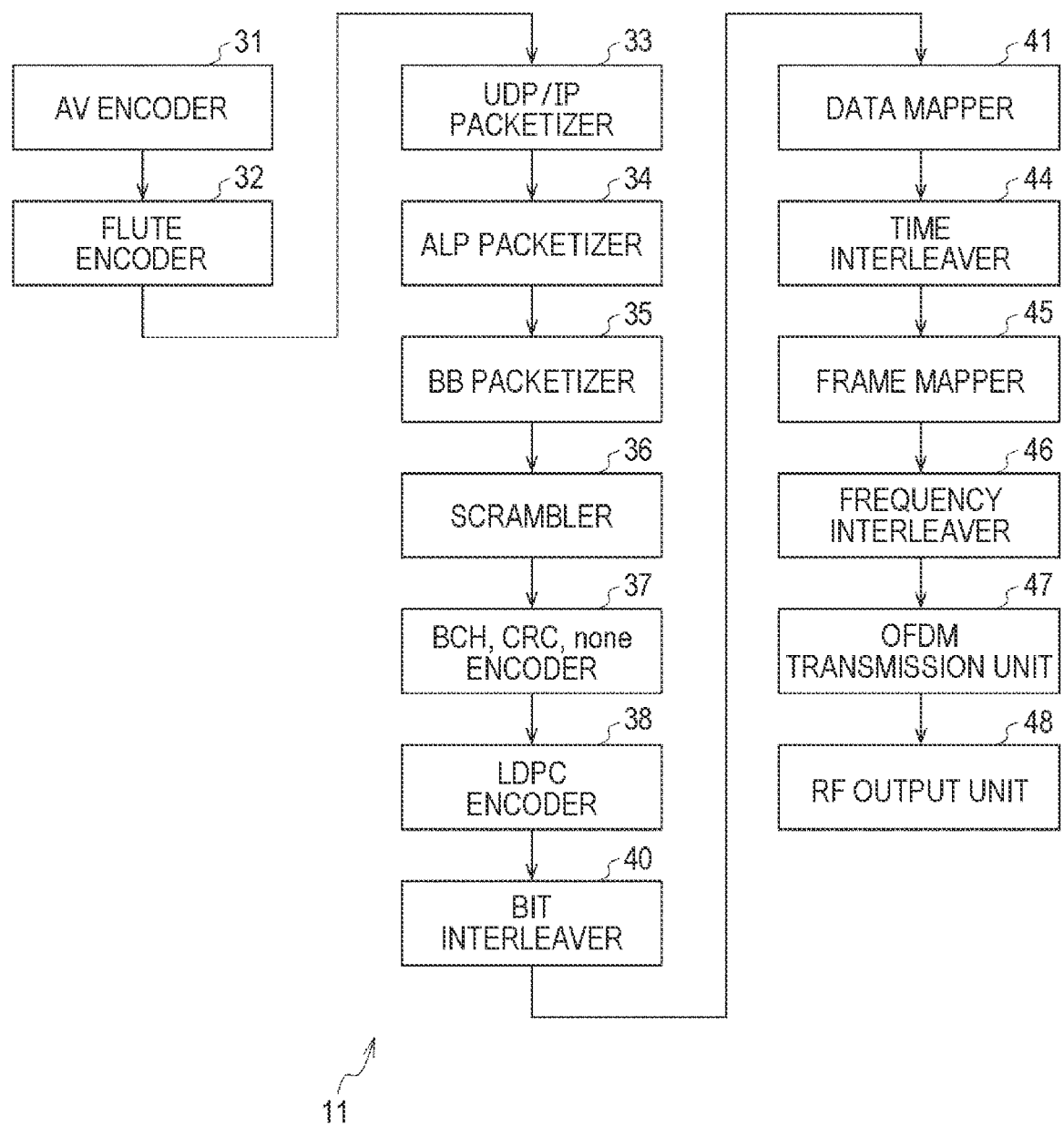
FIG. 2 is a diagram illustrating a configuration example of a transmission device in FIG. 1.

FIG. 2 is a diagram illustrating a configuration example of the transmission device 11 in FIG. 1.

In FIG. 2, the transmission device 11 includes an AV encoder 31, a FLUTE encoder 32, a UDP/IP packetizer 33, an ALP packetizer 34, a BB packetizer 35, a scrambler 36, a BCH, CRC, none encoder 37, an LDPC encoder 38, a bit interleaver 40, a data mapper 41, a time interleaver 44, a frame mapper 45, a frequency interleaver 46, an OFDM transmission unit 47, and an RE output unit 48.

The AV encoder 31 encodes (components of) video and audio data according to a predetermined encoding method, and supplies encoded data to the FLUTE encoder 32. The FLUTE encoder 32 processes (encodes) the data from the AV encoder 31, generates data corresponding to a File Delivery over Unidirectional Transport (FLUTE) format, and supplies the data to the UDP/IP packetizer 33.

The UDP/IP packetizer 33 processes the data from the FLUTE encoder 32, generates an IP packet (UDP/IP packet) including the UDP packet, and supplies the IP packet to the ALP packetizer 34. The ALP packetizer 34 processes the UDP/IP packet from the UDP/IP packetizer 33, generates an ATSC Link layer Protocol (ALP) packet, and supplies the ALP packet to the BB packetizer 35.

The BB packetizer 35 processes the ALP packet (second packet) from the ALP packetizer 34, generates a baseband (BB) packet (first packet), and supplies the BB packet to the scrambler 36. The scrambler 36 scrambles data (BB packet) from the BB packetizer 35, and supplies resulting data to the BCH, CRC, none encoder 37.

The BCH, CRC, none encoder 37 encodes the data from the scrambler 36, and supplies resulting data to the LDPC encoder 38. The LDPC encoder 38 performs low density parity check (LDPC) encoding on the data from the BCH, CRC, none encoder 37, and supplies resulting data to the bit interleaver 40.

The bit interleaver 40 performs bit interleaving on the data from the LDDC encoder 38, and supplies the data after the bit interleaving to the data mapper 41.

The data mapper 41 performs quadrature modulation (multilevel modulation) by mapping the data from the bit interleaver 40 to a signal point representing one symbol of the quadrature modulation in units (symbol units) of code bits of one or more bits of the data (LDPC code). Data obtained by the processing in the data mapper 41 is supplied to the time interleaver 44.

The time interleaver 44 performs time interleaving on the data from the data mapper 41, and supplies the data after the time interleaving to the frame mapper 45.

The frame mapper 45 performs processing related to a frame (physical layer frame) on the data from the time interleaver 44, and supplies resulting data to the frequency interleaver 46. The frequency interleaver 46 performs frequency interleaving on the data from the frame mapper 45, and supplies the data after the frequency interleaving to the OFDM transmission unit 47.

The OFDM transmission unit 47 processes the data from the frequency interleaver 46, generates an orthogonal frequency division multiplexing (OFDM) signal, and supplies the OFDM signal to the SF output unit 48. The RF output unit 48 is connected to an antenna (not illustrated), and transmits the OFDM signal from the OFDM transmission unit 47 as a radio frequency (RF) signal via the transmission path 13.

The transmission device 11 is configured as described above.

<Configuration Example of Reception Device 12>

Figure 3:
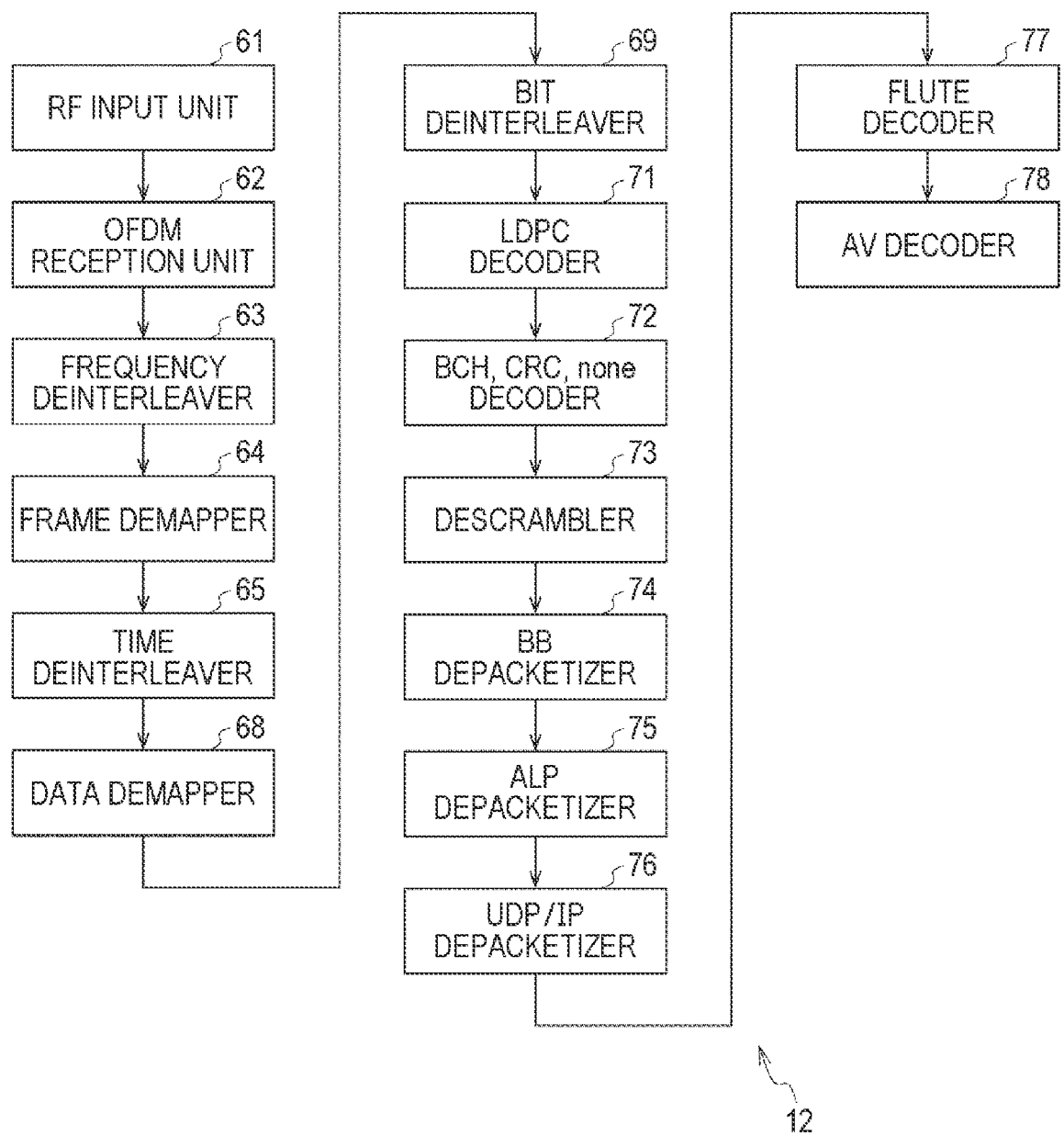
FIG. 3 is a diagram illustrating a configuration example of a reception device in FIG. 1.

FIG. 3 is a diagram illustrating a configuration example of the reception device 12 in FIG. 1.

In FIG. 3, the reception device 12 includes an RF input unit 61, an OFDM reception unit 62, a frequency deinterleaver 63, a frame demapper 64, a time deinterleaver 65, a data demapper 68, a bit deinterleaver 69, an LDDC decoder 71, a BCH, CRC, none decoder 72, a descrambler 73, a BE depacketizer 74, an ALP depacketizer 75, a UDP/IP depacketizer 76, a FLUTE decoder 77, and an AV decoder 78.

The RF input unit 61 is connected to an antenna (not illustrated), receives an RF signal transmitted from the transmission device 11 via the transmission path 13, and supplies the RF signal as an OFDM signal to the OFDM reception unit 62. The OFDM reception unit 62 processes the OFDM signal from the RF input unit 61 and supplies data obtained by the processing to the frequency deinterleaver 63.

The frequency deinterleaver 63 performs frequency deinterleaving on the data from the OFDM reception unit 62, and supplies the data after the frequency deinterleaving to the frame demapper 64. The frame demapper 64 performs processing related to a frame (physical layer frame) on the data from the frequency deinterleaver 63, and supplies resulting data to the time deinterleaver 65.

The time deinterleaver 65 performs time deinterleaving on the data from the frame demapper 64, and supplies the data after the time deinterleaving to the data demapper 68.

The data demapper 68 performs demapping (signal point arrangement decoding) and quadrature demodulation on the data (data on the constellation) from the time deinterleaver 65 on the basis of the arrangement (constellation) of signal points determined by the quadrature modulation performed on the transmission device 11 side, and supplies resulting data (LDPC code) to the bit deinterleaver 69.

The bit deinterleaver 69 performs bit deinterleaving on the data from the data demapper 68, and supplies the data after the bit deinterleaving to the LDPC decoder 71.

The LDDC, decoder 71 performs LDPC decoding on the data from the bit deinterleaver 69, and supplies resulting data to the BCH CRC, none decoder 72. The BCH, CRC, none decoder 72 decodes the data from the LDPC decoder 71, and supplies resulting data to the descrambler 73. The descrambler 73 descrambles the data from the BCH, CRC, none decoder 72, and supplies resulting data to the BB depacketizer 74.

The BB depacketizer 74 extracts and processes the BB packet from the data from the de scrambler 73, and supplies resulting data to the ALP depacketizer 75.

The ALP depacketizer 75 extracts and processes the ALP packet from the data from the BB depacketizer 74, and supplies resulting data to the UDP/TP depacketizer 76, The UDP/IP depacketizer 76 extracts and processes the UDP/IP packet from the data from the ALP depacketizer 75, and supplies resulting data to the FLUTE decoder 77.

The FLUTE decoder 77 processes (decodes) the data (data corresponding to the FLUTE format) from the UDP/IP depacketizer 76, and supplies resulting data to the AV decoder 78. The AV decoder 78 decodes the data from the FLUTE decoder 77 according to a predetermined decoding method, and outputs (components of) video and audio data obtained as a result.

The reception device 12 is configured as described above.
<Configuration Example of First Embodiment of ALP Depacketizer 75>

Figure 4:
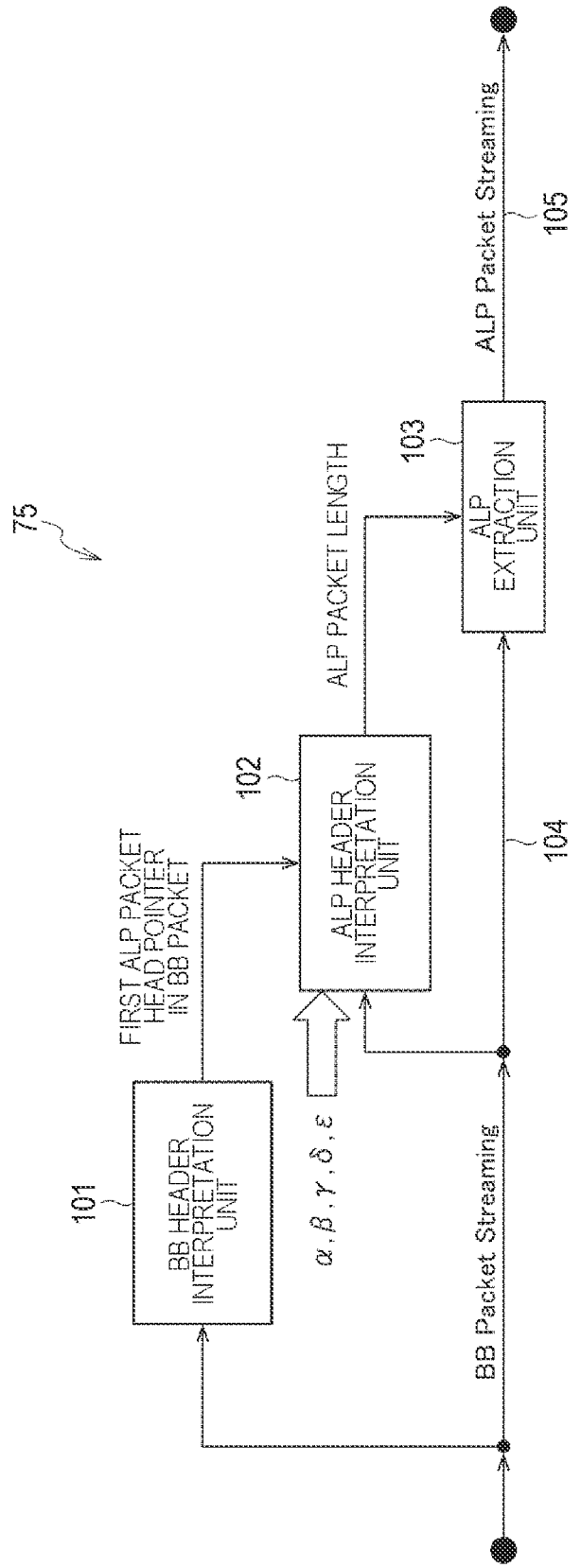
FIG. 4 is a block diagram illustrating a configuration example of a first embodiment of an ALP depacketizer.

FIG. 4 is a block diagram illustrating a configuration example of the first embodiment of the ALP depacketizer 75.

The ALP depacketizer 75 (processing unit) includes a BB header interpretation unit 101, an ALP header interpretation unit 102, and an ALP extraction unit 103.

The BB header interpretation unit 101 acquires data of the BE packet from a transmission line 104 and acquires data of a BB header of the BB packet. The transmission line 104 transmits the data of the BB packet from the BB depacketizer 74 in FIG. 3 to the ALP extraction unit 103.

Here, a structure of the BB packet will be described.

Figure 5:
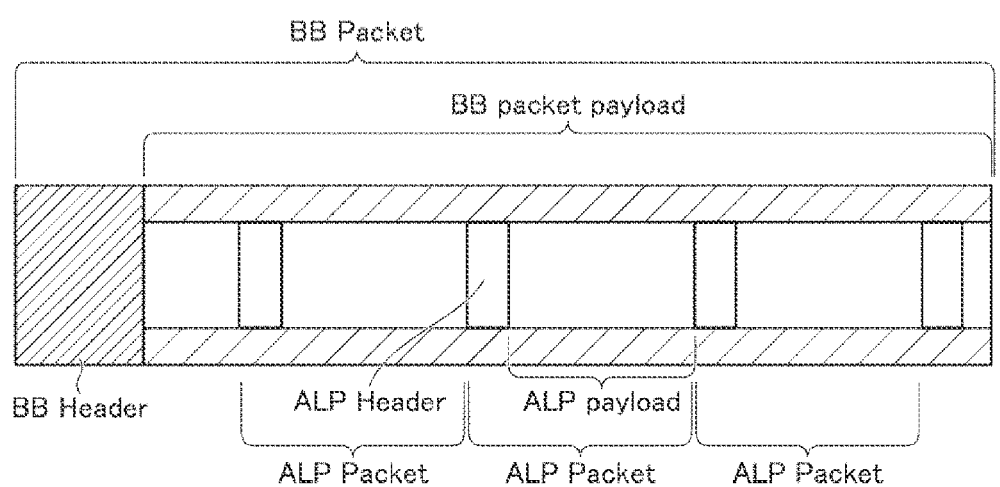
FIG. 5 is a diagram illustrating a structure of a BB packet.

FIG. 5 is a diagram illustrating the structure of the BB packet.

The BB packet includes a BE header and a BB payload (BB packet payload).

The BB header includes data such as a length (packet length) of the BB packet and an ALP head pointer (described later). One or a plurality of ALP packets (ALP packets) is stored in the BE payload.

The ALP packet includes an ALP header and an ALP payload.

The ALP header includes data specifying a packet type, a length (header length) of the ALP header, a length (payload length) of the ALP payload, and the like. In the ALP payload, one or a plurality of IP packets is stored as transmission data.

In FIG. 4, upon acquiring the data of the BB header from the transmission line 104, the BB header interpretation unit 101 acquires the ALP head pointer included in the BB header. The ALP head pointer is data indicating a head position of the first (head) ALP header of the ALP header of the ALP packet stored in the BB packet.

Note that an ALP packet including a first ALP header in the BB packet (an ALP packet including a first LLP header and an ALP payload subsequent thereto) is referred to as a head ALP packet.

The BB header interpretation unit 101 supplies the ALP head pointer to the ALP header interpretation unit 102.

Note that the BB header interpretation unit 101 may be a component of the BB depacketizer 74 in FIG. 3.

The ALP header interpretation unit 102 acquires the data of the ALP header of the ALP packet from the BB packet transmitted by the transmission line 104. Furthermore, the LLP header interpretation unit 102 detects a packet length (ALP packet length) of the ALP packet on the basis of the acquired data of the ALP header, and specifies the head position of the ALP packet to be transmitted next. Note that the ALP header interpretation unit 102 has a function of correcting the data when detecting the packet length on the basis of the data of the ALP header, which will be described later in detail.

The ALP header interpretation unit 102 supplies the detected ALP packet length to the ALP extraction unit 103. Note that details of the ALP packet length detection processing and the like will be described later.

The ALP extraction unit 103 extracts the ALP packet from the BB packet transmitted through the transmission line 104 on the basis of the ALP packet length from the ALP header interpretation unit 102, and supplies the extracted ALP packet co the UDP/IP depacketizer 76 in FIG. 3 through the transmission line 105.
(Extraction of ALP Packet)

Figure 6:
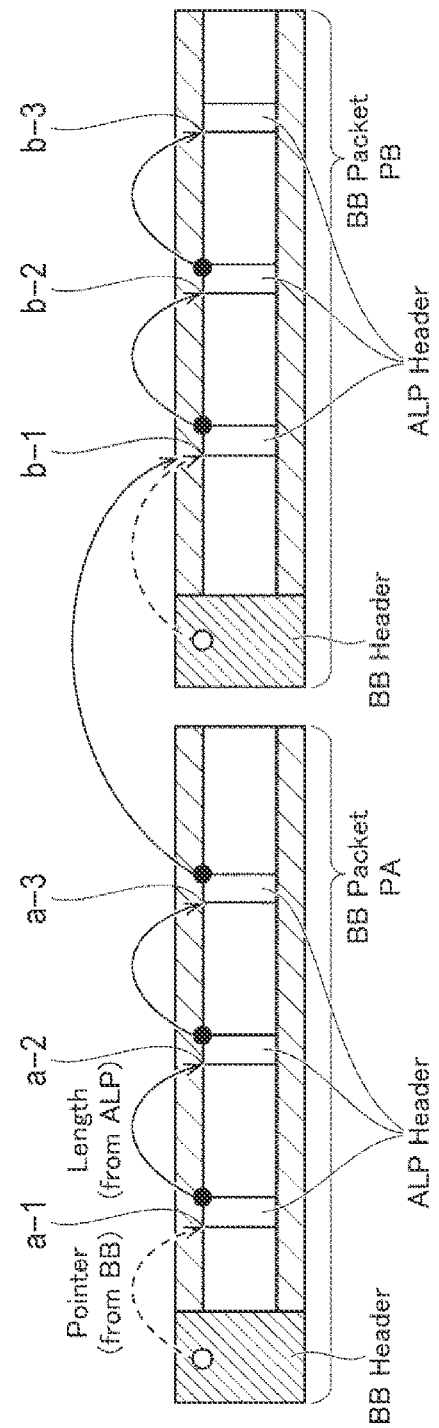
FIG. 6 is an explanatory diagram illustrating processing of extracting an ALP packet from the BB packet.

FIG. 6 is an explanatory diagram illustrating processing of extracting the ALP packet from the BB packet.

In FIG. 6, a BB packet PA and a BB packet PB adjacent to each other on the left and right sides illustrate two BB packets sequentially transmitted from the BB depacketizer 74 to the ALP extraction unit 103 via the transmission Line 104.

The BB header interpretation unit 101 in FIG. 4 acquires the data of the BB header of the SB packet PA from the transmission line 104 and detects the ALP head pointer included in the BB header.

The ALP head pointer is data that specifies a head position a-1 of a first (head) ALP header among one or a plurality of ALP headers included in the BB packet PA. Assuming that the ALP packet including the first ALP header in an arbitrary BB packet is referred to as a head ALP packet, the ALP head pointer is data specifying the head position of the head ALP packet. Note that the head position of the ALP packet, the ALP header, or the like represents the position of a head bit of the ALP packet, the ALP header, or the like in a bit string of the BB packet.

The BB header interpretation unit 101 supplies the detected ALP head pointer to the ALP header interpretation unit 102.

The ALP header interpretation unit 102 specifies the head position a-1 of the head ALP packet on the basis of the ALP head pointer.

Furthermore, the ALP header interpretation unit 102 acquires the data of the ALP header of the head ALP packet in the BB packet PA from the transmission line 104 on the basis of the ALP head pointer from the BB header interpretation unit 101.

The ALP header interpretation unit 102 detects the header length of the ALP header and the payload length of the ALP payload (the header length and the payload length of the ALP packet) on the basis of the data of the ALP header of the acquired head ALP packet. Then, the ALP header interpretation unit 102 calculates (detects) the packet length of the head ALP packet by adding the header length and the payload length. Note that the ALP header interpretation unit 102 has a function of correcting the payload length of the ALP header, which will be described later in detail.

The ALP header interpretation unit 102 specifies a head position a-2 of the second ALP packet (the ALP packet next to the head ALP packet) in the BB packet PA on the basis of the packet length of the detected head ALP packet. The head position a-2 of the second ALP packet is a position of a bit following a tail position (position of a tail bit) of the head ALP packet according to the packet length of the head ALP packet.

Furthermore, the ALP header interpretation unit 102 supplies the packet length of the detected head ALP packet to the ALP extraction unit 103.

The ALP extraction unit 103 extracts the head ALP packet from the head position a-1 of the head ALP packet to the head position a-2 of the second ALP packet from the BB packet PA (BB payload) on the basis of the ALP packet length from the ALP header interpretation unit 102.

As described above, the ALP header interpretation unit 102 specifies the head position of the head ALP packet on the basis of the ALP head pointer of the BB header for each BE packet.

Furthermore, the ALP header interpretation unit 102 specifies each of the head positions of the ALP packets included in each BE packet on the basis of the packet length of the previous ALP packet (specifies the head position of the net ALP packet on the basis of the packet length of the ALP packet). In other words, the ALP header interpretation unit 102 specifies the tail position (the position of the tail bit) of the previous ALP packet on the basis of the head position and the packet length of the previous ALP packet among two consecutive ALP packets before and after. Then, the ALP header interpretation unit 102 specifies the position of the next bit of the tail position of the previous ALP packet as the head position of the subsequent ALP packet. Note that the ALP header interpretation unit 102 detects the packet length of the previous ALP packet on the basis of the data of the ALP header of the previous ALP packet.

Furthermore, the ALP header interpretation unit 102 supplies the packet length (ALP packet length) of the ALP packet detected from the ALP header to the ALP extraction unit 103.

The ALP extraction unit 103 detects timings at which the head position a-2 and a head position a-3 of the second and subsequent ALP packets of the BB packet PA in FIG. 6 are transmitted from the transmission line 104 by counting with an auto-running counter on the basis of the ALP packet length from the ALP header interpretation unit 102.

Thus, the ALP extraction unit 103 extracts the ALP packet included in the BB packet from the BB depacketizer 74 for each ALP packet. Then, the ALP extraction unit 103 supplies the ALP packet extracted from the BB packet from the BB depacketizer 74 to the UDP/IP depacketizer 76 in FIG. 3 via the transmission line 105.

In FIG. 6, the third ALP packet in the BB packet PA is divided into the BB packet PA and the BB packet PB. In this manner, in a case where the data of one ALP packet is divided into a plurality of BB packets and transmitted, the data of the BB header of the BB packet is interposed in the data of the one ALP packet transmitted to the ALP extraction unit 103.

The ALP extraction unit 103 extracts the data of the ALP packet from the data of the BB payload excluding the data of the BB header, and concatenates the data extracted for the common (identical) LP packet.

For example, for the third ALP packet in the BB packet PA in FIG. 6, the ALP extraction unit 103 extracts data from the data at the head position a-3 of the third ALP packet to the data at the tail position of the BB packet PA among the data of the BB payload of the BB packet PA.

Furthermore, the ALP extraction unit 103 extracts data from data of the head position of the BB payload to data of the bit immediately before a head position b-1 of the head ALP packet, among the data of the BB payload of the BB packet PB subsequent to the BB packet PA. Then, the ALP extraction unit 103 connects the data extracted from each of the BB packet PA and the BB packet PB.

Thus, even in a case where the data of one ALP packet is divided into a plurality, of BB packets and transmitted, the ALP packet divided into the BB packet PA and the BB packet PB is extracted as one ALP packet.

Here, the ALP header interpretation unit 102 and the ALP extraction unit 103 can specify the head position of the head ALP packet in the BB packet on the basis of the ALP packet length similarly to the ALP packet other than the head ALP packet. In other words, in a case where the head position of the next IP packet specified on the basis of the ALP packet length is a position within the data range of the next or subsequent BB packet, the next ALP packet is the head ALP packet included in the next or subsequent BB packet. In this case, the ALP header interpretation unit 102 can specify, as the head position of the head ALP packet, the position of the bit next to the tail position where the number of data from the head position of the ALP packet in the BB payload excluding the data of the BB header is the packet length of the ALP packet.

For example, the ALP header interpretation unit 102 and the ALP extraction unit 103 specify the head position b-1 of the head ALP packet in the BB packet PB in FIG. 6 on the basis of the packet length of the third ALP packet in the BB packet PA. Also for the head ALP packet of the BB packet PA in FIG. 6, in a case where the ALP packet is transmitted by the PB packet, which is not illustrated, before the BB packet PA, the ALP header interpretation unit 102 can specify the head position a-1 of the head ALP packet on the basis of the packet length of the ALP packet immediately before the BB packet PA.

<Structure of ALP Packet (ALP Header)>

The ALP packet has a structure according to ATSC 3.0 which is a terrestrial broadcast standard, and will be mainly described focusing on the header length and the payload length of the ALP packet, and description of content, meaning, and the like of data included in the ALP packet will be appropriately omitted.

There is a plurality of packet types in the ALP packet, and the ALP header includes data representing the packet type (Packet_Type) of the ALP packet. Specifically, the packet type is data of 3 bits, and represents eight packet types of 000 to 111 in binary.

FIG. 7 is a diagram illustrating a value (Packet_Type Value) of the packet type of the ALP packet and the meaning (Meaning) of the packet type of each value.

Note that each packet type in a case where the value of the packet type is 000 to 111 is referred to as packet type 000 to packet type 111.

As the packet type, eight packet types 000 to 111 are defined. The currently valid packet types are five of packet type 000, packet type 010, packet type 100, packet type 110, and packet type 111 excluding three of packet type 001, packet type 011, and packet type 101 secured as reserved.

<Packet Type 000 and Packet Type 010>

Figure 8:
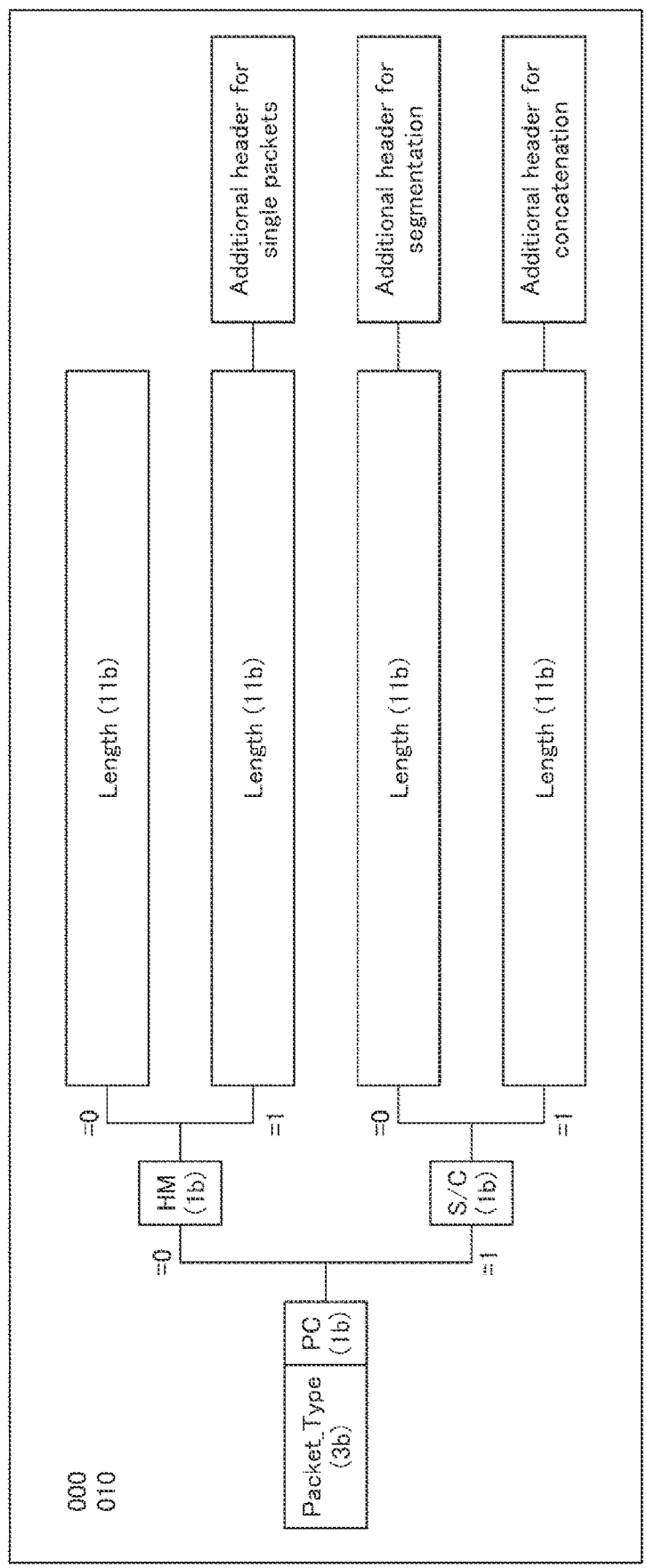
FIG. 8 is a diagram illustrating structures of ALP headers of a packet type 000 and a packet type 010.

FIG. 8 is a diagram illustrating structures of the ALP headers of the packet type 000 and the packet type 010.

Figure 10:
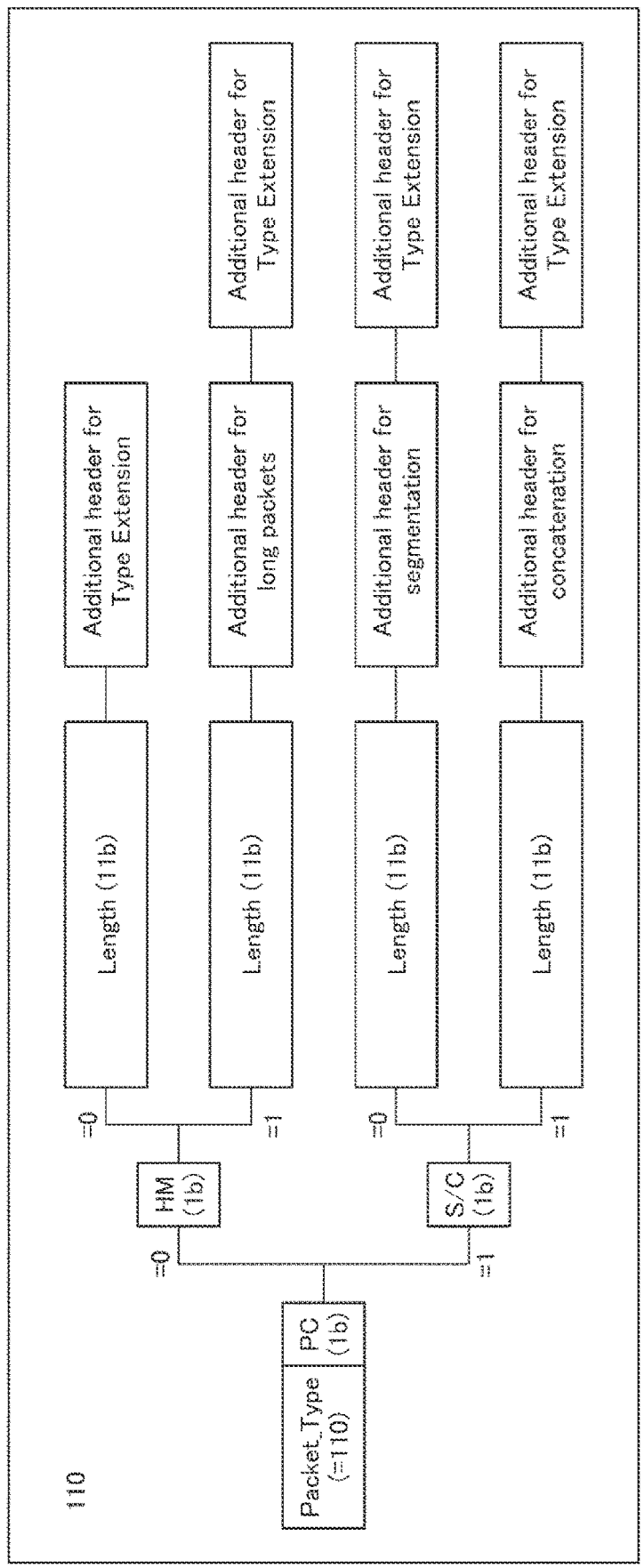
FIG. 10 is a diagram illustrating a structure of an ALP header of packet type 110.

In FIG. 8, the 3-bit (3 b) Packet_Type is arranged at the head of the ALP header. The Packet_Type is data representing a packet type, and in FIG. 8, 000 or 010 is set to the Packet_Type.

After the Packet_Type, a 1-bit (1 b) Payload Configuration (PC) is arranged. The PC is set to 0 or 1.

In a case where the PC is 0, a 1-bit Header_Mode (HM) is arranged after the PC. The HM is set to 0 or 1.

In a case where the PC is 1, a 1-bit segmentation_concatenation (S/C) is arranged after the PC. The S/C is set to 0 or 1.

(Case where PC=0 and HM=0)

In a case where the PC is 0 and the HM is 0, only an 11-bit (11 b) Length is arranged after the HM. The Length represents a payload length of the ALP payload. In a case where the PC is 0 and the HM is 0, the payload length of the ALP payload may take a value in a range of 0 to 2047 bits that can be represented by 11 bits.

In a case where the PC data is 0 and the HM data is 0, as described above, only the 11-bit Length is arranged after the HM, and thus the header length of the ALP header is 3+1+1+11=16 bits (2 bytes).

(Case where PC=0 and HM=1)

In a case where the PC is 0 and the HM is 1, the 11-bit (11 b) Length and 8-bit Additional header for single packets (Additional header for long packets) are arranged after the HM. In a case where the PC is 0 and the HM is 1, the payload length of the ALP payload may take a value that can be represented by 16 bits, and data of low-order 11 bits among 16 bits representing the payload length is set to the Length.

The Additional header for single packets includes data of high-order 5 bits (Length_MSB which is not illustrated) among 16 bits representing the payload length of the ALP payload. The payload length of the ALP payload is represented data of 16 bits in total in which the Length PSP used as a high-order bit and the Length is concatenated as a low-order bit, and can take a value in a range of 0 to 65535 bits.

The Additional header for single packets includes a substream identifier flag (SIF), a header extension flag (HEF), and the like which are not illustrated other than the Length_MSB.

The header length of the ALP header in a case where the PC is 0 and the HM is 1 is 3+1+1+11+8=24 bits (3 bytes).

(Case where PC=1 and S/C=0)

In a case where the PC is 1 and the S/C is 0, the 11-bit (11 b) Length and 8 bit Additional header for segmentation are arranged after the S/C. The Length represents a payload length of the ALP payload. In a case where the PC is 0 and the S/C is 0, the payload length of the ALP payload may take a value in the range of 0 to 2047 bits that can be represented by the 11-bit Length.

The Additional header for segmentation includes Seg_SN (segment_sequence_number), LSI (last_segment_indicator), SIF (Sub-stream Identifier Flag), and HEF (Header Extension Flag) which are not illustrated.

The header length of the ALP header in a case where the PC is 1 and S/C is 0 is 3+1+1+11+8=24 bits (3 bytes).

(Case where PC=1 and S/C=1)

In a case where the PC is 1 and the S/C is 1, the 11-bit (11 b) Length and a variable-length Additional header for concatenation are arranged after the S/C. In a case where the PC is 1 and the S/C is 1, the payload length of the ALP payload may take a value that can be represented by 15 bits, and data of low-order 11 bits among 15 bits representing the payload length is set in the Length.

The Additional header for concatenation includes data of high-order 4 bits (Length_MSB which is not illustrated) among 15 bits representing the payload length of the ALP payload. The payload length of the ALP payload is represented by data of 15 bits in total in which the Length_MSB is used as a high-order bit and the Length is concatenated as a low-order bit, and can take a value within a range of 0 to 32766 bits.

The Additional header for concatenation includes a 3-bit Count, a 1-bit SIF (Sub-stream identifier Flag), and a variable-length Component Length other than the Length MSB.

The header length (bit depth) of the ALP header in a case where the PC is 1 and the S/C is 1 is $24+(d-1)\cdot 12+e$.

Here, 24 bits (3 bytes) out of $24+(d-1)\cdot 12+e$ which is the header length (bit depth) of the ALP header is a number of bits obtained by adding 3+1+1+11=16 bits (2 bytes) which is the sum of the bit depths of the packet type (Packet_Type), the PC, the S/C, and the Length and 4+3+1=8 bits (1 byte) which is the sum of the bit depths of the Length MSB, the Count, and the SIF in the Additional header for concatenation.

d in $24+(d-1)\cdot 12+e$ which is the header length (bit depth) of the ALP header is a value of the 3-bit Count in the Additional header for concatenation, and the value d of the Count represents the number of IP packets included in the ALP payload. Furthermore, in the Additional header for concatenation, the Component Length represents the packet length of each IP packet excluding the last IP packet among the IP packets included in the ALP payload. Since the packet length of one IP packet can take a value represented by 12 bits, the Component Length has data of $(d-1)\times 12$ bits representing packet lengths of $(d-1)$ IP packets. Therefore, $(d-1)\cdot 12$ in $24+(d+1)\cdot 12+e$ which is the header length (bit depth) of the ALP header represents the bit depth of the Component Length.

The e bit in $24+(d-1)\cdot 12+e$ which is the header length (bit depth) of the ALP header is 0 bits in a case where the value d of the Count is an odd number, and is 4 bits in a case where the value d of the Count is an even number. Therefore, $\{3+(d-1)\cdot 3/2+e/8\}$ (bytes) in a case where $24+(d-1)\cdot 12+e$ is divided by 8 (bits) and represented in byte units is $3+3\cdot m$ (bytes) in a case where d is an odd number (d=2m+1:m in is a natural number), and is $2+3\cdot m$ (bytes) in a case where d is an even number (d=2m) (m is a natural number). In either case, the number of bytes of the header length of the ALP header is a natural number.

Note that, hereinafter, the bit depth of the Additional header for concatenation obtained by the value d of the Count is represented by AHb(d). In this case, the header length (bit depth) of the ALP header is 16+AHb(d).

<Packet Type 100>

Figure 9:
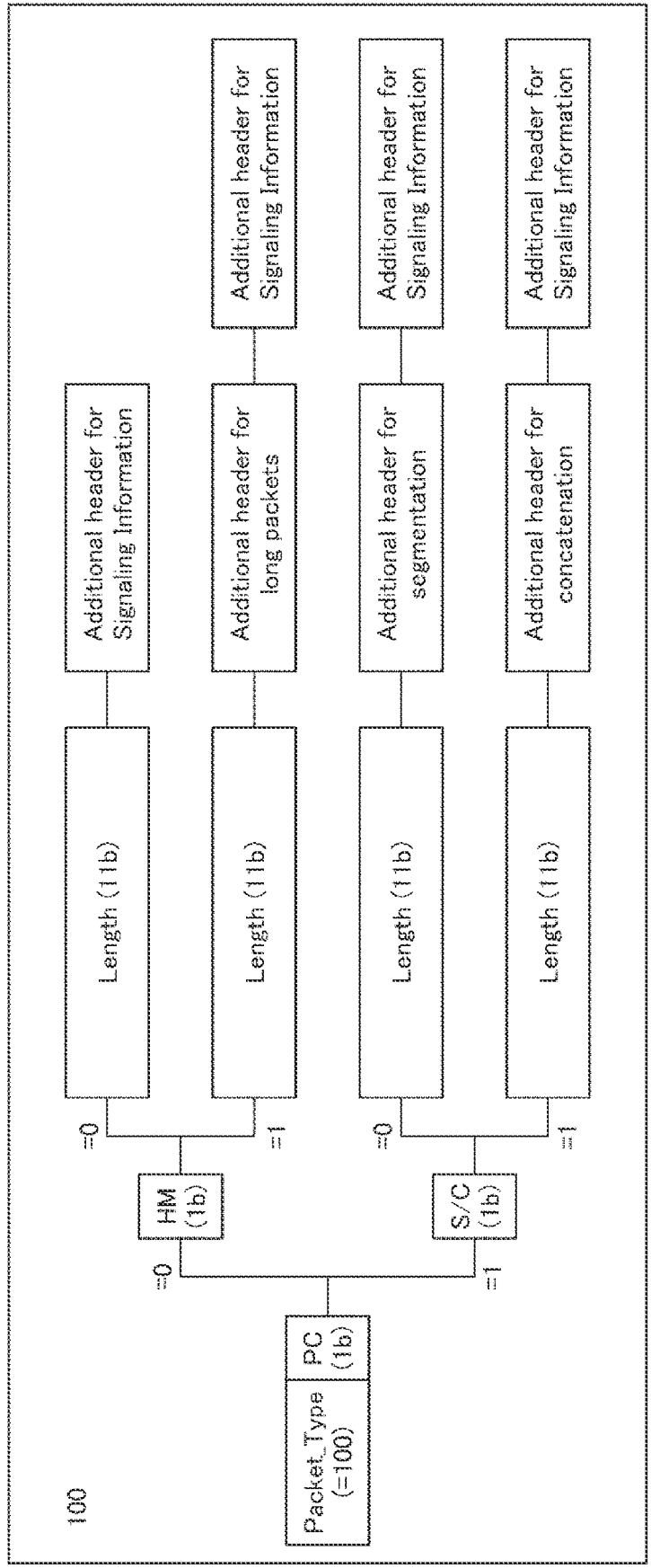
FIG. 9 is a diagram illustrating a structure of an ALP header of packet type 100.

FIG. 9 is a diagram illustrating a structure of the ALP header of the packet type 100.

The ALP header of the packet type 100 in FIG. 9 is common to the ALP header in FIG. 8 in including the 3-bit packet type (Packet_Type) and the 1-bit PC in order from the head of the ALP header. Note that, in FIG. 9, 100 is set to the Packet_Type.

Furthermore, the ALP header in FIG. 9 is common to the ALP header in FIG. 8 in including the 1-bit HM after the PC in a case where the PC is 0, and the 1-bit S/C after the PC in a case where the PC is 1. Moreover, the ALP header in FIG. 9 is common to the ALP header in FIG. 8 in that, in a case where the PC is 0 and the HM is 0, the 11-bit Length is included after the HM, in a case where the PC is 0 and the HM is 1, the 11-bit Length and the 8-bit Additional header for long packets (Additional header for single packets) are included after the HM, in a case where the PC is 1 and the S/C is 0, the 11-bit Length and the 8-bit Additional header for segmentation are included after the S/C, and in a case where the PC is 1 and the S/C is 1, the 11-bit Length and the AHb(d)-bit Additional header for concatenation are included.

However, the ALP header in FIG. 9 is different from the ALP header in FIG. 8 in that an Additional header for Signaling information is newly included after the Length in a case where the HM is 0, the Additional header for Signaling Information is newly included after the Additional header for long packets in a case where the HM is 1, the Additional header for Signaling Information is newly included after the Additional header for segmentation in a case where the S/C is 0, and the Additional header for Signaling Information is newly included after the Additional header for concatenation in a case where the S/C is 1.

In the ALP header in FIG. 9, the Additional header for Signaling Information for the HM of an arbitrary value and the S/C of an arbitrary value is data of 40 bits (5 bytes). The Additional header for Signaling Information includes signaling_type, signaling_type_extension, signaling_version, signaling_format, and signaling_encoding which are not illustrated.

(Case where PC=0 and HM=0)

In a case where the PC is 0 and the HM is 0, the payload length of the ALP payload is the same as in a case where the PC is 0 and the HM is 0 in FIG. 8, and may take a value in the range of 0 to 2047 bits that can be represented by the 11-bit Length.

The header length of the ALP header is 56 bits (7 bytes) obtained by adding 3+1+1+11=16 bits (2 bytes), which is the sum of the bit depths of the 3-bit packet type (Packet_Type), the 1-bit PC, the 1-bit HM, and the 11-bit Length, and 40 bits (5 bytes), which is the bit depth of the Additional header for Signaling Information.

(Case where PC=0 and HM=1)

In a case where the PC is 0 and the HM is 1, the payload length of the ALP payload is the same as that in a case where the PC is 0 and the HM is 1 in FIG. 8, and is represented by data of 16 bits in total in which 5-bit Length_MSB which is not illustrated in the Additional header for long packets is used as high-order bits and the Length is concatenated as low-order bits. Therefore, the payload length of the ALP payload can take a value in a range of 0 to 65535 bits.

The header length of the ALP header is 64 bits (8 bytes) obtained by adding 3+1+1+11+8=24 bits (3 bytes), which is the sum of the bit depths of the 3-bit packet type (Packet_Type), the 1-bit PC, the 1-bit HM, the 11-bit Length, and the 8-bit Additional header for single packets, and 40 bits (5 bytes), which is the bit depth of the Additional header for Signaling Information.

(Case where PC=1 and S/C=0)

In a case where the PC is 1 and the S/C is 0, the payload length of the ALP payload is the same as that in a case where the PC is 1 and the S/C is 0 in FIG. 8, and may take a value in the range of 0 to 2047 bits that can be represented by the 11-bit Length.

The header length of the ALP header is 64 bits (8 bytes) obtained by adding 24 bits (3 bytes), which is the sum of the bit depths of the 3-bit packet type (Packet_Type), the 1-bit PC, the 1-bit HM, the 11-bit Length, and the 8-bit Additional header for segmentation, and 40 bits (5 bytes), which is the bit depth of the Additional header for Signaling information.

(Case where PC=1 and S/C=1)

In a case where the PC is 1 and the S/C, is 1, the payload length of the ALP payload is the same as that in a case where the PC is 1 and the S/C is 1 in FIG. 8, and is represented by data of 15 bits in total in which 4-bit Length_MSB which is not illustrated in the Additional header for concatenation is used as high-order bits and the Length is concatenated as low-order bits, and can take a value in a range of 0 to 32766 bits.

The header length of the ALP header is 56 bits (7 bytes)+AHh(d) bits obtained by adding 16 bits (2 bytes)+AHb(d) bits, which is the sum of the bit depths of the 3-bit packet type (Packet_Type), the 1-bit PC, the 1-bit HM, the 11-bit Length, and the ARb(d)-bit Additional header for concatenation, and 40 bits (5 bytes), which is the bit depth of the header for Signaling Information. The AHb(d) is the bit depth of the Additional header for concatenation described in the ALP header in FIG. 8, and is obtained by a value d of the Count data included in the Additional header for concatenation.

<Packet Type 110>

FIG. 10 is a diagram illustrating a structure of the ALP header of the packet type 110.

The ALP header of the packet type 110 in FIG. 10 is common to the ALP header in FIG. 8 in including the 3-bit packet type (Packet_Type) and the 1-bit PC in order from the head of the ALP header. Note that, in FIG. 10, 110 is set to the Packet_Type.

Furthermore, the ALP header in FIG. 10 is common to the ALP header in FIG. 8 in including the 1-bit HM after the PC in a case where the PC is 0, and the 1-bit S/C after the PC in a case where the PC is 1. Moreover, the ALP header in FIG. 10 is common to the ALP header in FIG. 8 in that, in a case where the PC is 0 and the HM is 0, the 11-bit Length is included after the HM, in a case where the PC is 0 and the HM is 1, the 11-bit Length and the 8-bit Additional header for long packets (Additional header for single packets) are included after the HM, in a case where the PC is 1 and the S/C is 0, the 11-bit Length and the 8-bit Additional header for segmentation are included after the S/C, and in a case where the PC is 1 and the S/C is 1, the 11-bit Length and the AHb(d)-bit Additional header for concatenation are included.

However, the ALP header in FIG. 10 is different from the ALP header in FIG. 8 in that newly including an Additional header for Type Extensin is newly included after the Length in a case where the HM is 0, the Additional header for Type Extensin is newly included after the Additional header for single packets in a case where the HM is 1, the Additional header for Type Extensin is newly included after the Additional header for segmentation in a case where the S/C is 0, and the Additional header for Type Extensin is newly included after the Additional header for concatenation in a case where the S/C is 1.

In the ALP header in FIG. 10, the Additional header for Type Extensin for the HM of an arbitrary value and the S/C of an arbitrary value is data of 16 bits (2 bytes). The Additional header for Type Extensin includes extended_type which is not illustrated.

(Case where PC=0 and HM=0)

In a case where the PC is 0 and the HM is 0, the payload length of the ALP payload is the same as in a case where the PC is 0 and the HM is 0 in FIG. 8, and may take a value in the range of 0 to 2047 bits that can be represented by the 11-bit Length.

The header length of the ALP header is 32 bits (4 bytes) obtained by adding 3+1+1+11=16 bits (2 bytes), which is the sum of the bit depths of the 3-bit packet type (Packet_Type), the 1-bit PC, the 1-bit HM, and the 11-bit Length, and 16 bits (2 bytes), which is the bit depth of the Additional header for Type Extensin.

(Case where PC=0 and HM=1)

In a case where the PC is 0 and the HM is 1, the payload length of the ALP payload is the same as that in a case where the PC is 0 and the HM is 1 in FIG. 8, and is represented by data of 16 bits in total in which 5-bit Length_MSB which is not illustrated in the Additional header for long packets is used as high-order bits and the Length is concatenated as low-order bits. Therefore, the payload length of the ALP payload can take a value in a range of 0 to 65535 bits.

The header length of the ALP header is 40 bits (5 bytes) obtained by adding 3+1+1+11+8=24 bits (3 bytes), which is the sum of the bit depths of the 3-bit packet type (Packet_Type), the 1-bit PC, the 1-bit HM, the 11-bit Length, and the 8-bit Additional header for single packets, and 16 bits (2 bytes), which is the bit depth of the Additional header for Type Extensin.

(Case where PC=1 and S/C=0)

In a case where the PC is 1 and the S/C is 0, the payload length of the ALP payload is the same as that in a case where the PC is 1 and the S/C is 0 in FIG. 8, and may take a value in the range of 0 to 2047 bits that can be represented by the 11-bit Length.

The header length of the ALP header is 40 bits (5 bytes) obtained by adding 24 bits (3 bytes), which is the sum of the bit depths of the 3-bit packet type (Packet_Type), the 1-bit PC, the 1-bit HM, the 11-bit Length, and the 8-bit Additional header for segmentation, and 16 bits (2 bytes), which is the bit depth of the Additional header for Type Extensin.

(Case where PC=1 and S/C=1)

In a case where the PC is 1 and the S/C is 1, the payload length of the ALP payload is the same as that in a case where the PC is 1 and the S/C is 1 in FIG. 8, and is represented by data of 15 bits in total in which 4-bit Length_MSB which is not illustrated in the Additional header for concatenation is used as high-order bits and the Length is concatenated as low-order bits. Therefore, the payload length of the ALP payload can take a value in a range of 0 to 32766 bits.

The header length of the ALP header is 32 bits (4 bytes)+AHb(d) bits obtained by adding 16 bits (2 bytes)+AHb(d) bits, which is the sum of the bit depths of the 3-bit packet type (Packet_Type), the 1-bit PC, the 1-bit HM, the 11-bit Length, and the AEb(d)-bit Additional header for concatenation, and 16 bits (2 bytes), which is the bit depth of the Additional header for Type Extensin. The AHb(d) is the bit depth of the Additional header for concatenation described in the ALP header in FIG. 8, and is obtained by a value d of the Count data included in the Additional header for concatenation.

<Packet Type 111>

Figure 11:
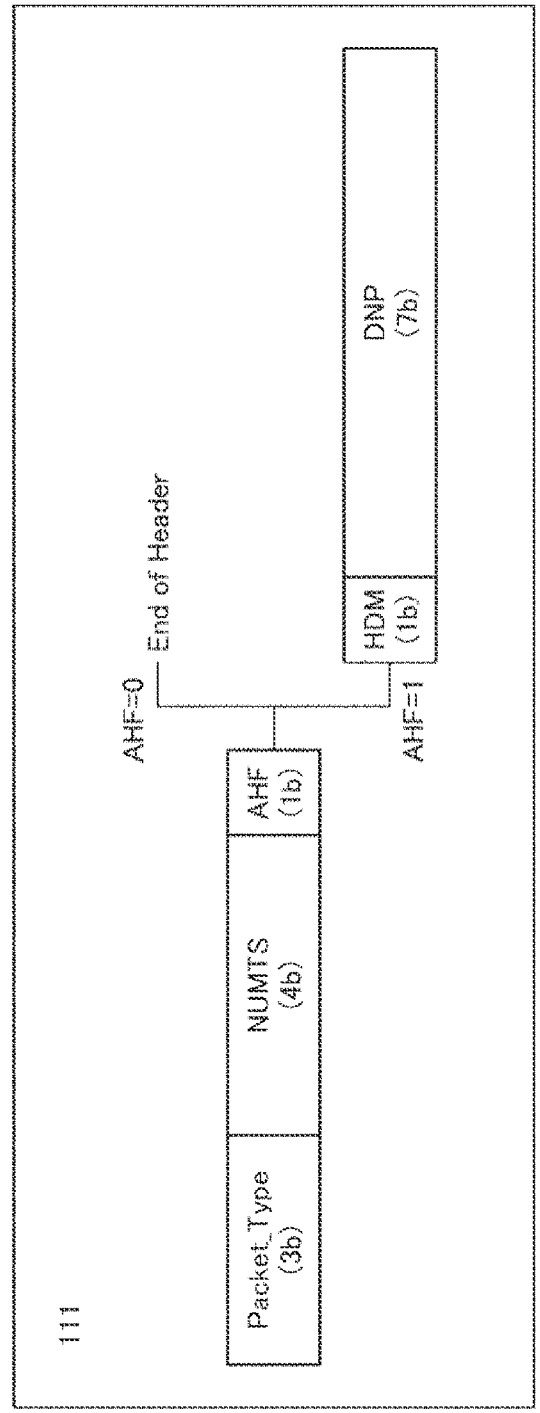
FIG. 11 is a diagram illustrating a structure of an ALP header of packet type 111.

FIG. 11 is a diagram illustrating a structure of the ALP header of the packet type 111.

In FIG. 11, 3-bit (3 b) Packet_Type representing a packet type is arranged at the head of the ALP header. In FIG. 11, 111 is set to the Packet_Type.

After the Packet_Type, four-bit (4 b) number of TS packets (NUMTS)) is arranged. In the NUNTS, the number of TS packets included in the ALP payload is set.

One-bit (1 b) additional header flag (AHF) is arranged after the NUMTS. The AHF is set to 0 or 1.

In a case where the AHF is 0, the AHF is data at the tail position of the ALP header. In a case where the AEF is 0, the header length of the ALP header is 3+4+1=8 bits (1 byte).

In a case where the AHF data is 1, a 1-bit (1 b) header deletion mode (HDM) is arranged after the AHF. In a case where the HDM is 1, the HDM indicates that the TS header of the TS packet in the ALP payload is deleted. In a case where the HDM is 0, the HDM indicates that the TS header of the TS packet in the ALP payload is not deleted.

After the HDM, 7-bit (7 b) deleted null packets (DNP) are arranged. The DNP represents the number of empty packets deleted.

In a case where the AHF is 1, the header length of the ALP header is 3+4+1+1+7=16 bits (2 bytes).

In either case where the AHF is 0 or 1, the payload length of the ALP payload is obtained on the basis of the value of the NUMTS in consideration of the packet length of the TS packet or the like stored in the ALP payload.

<Example of ALP Packet of Packet Type 000>

Figure 12:
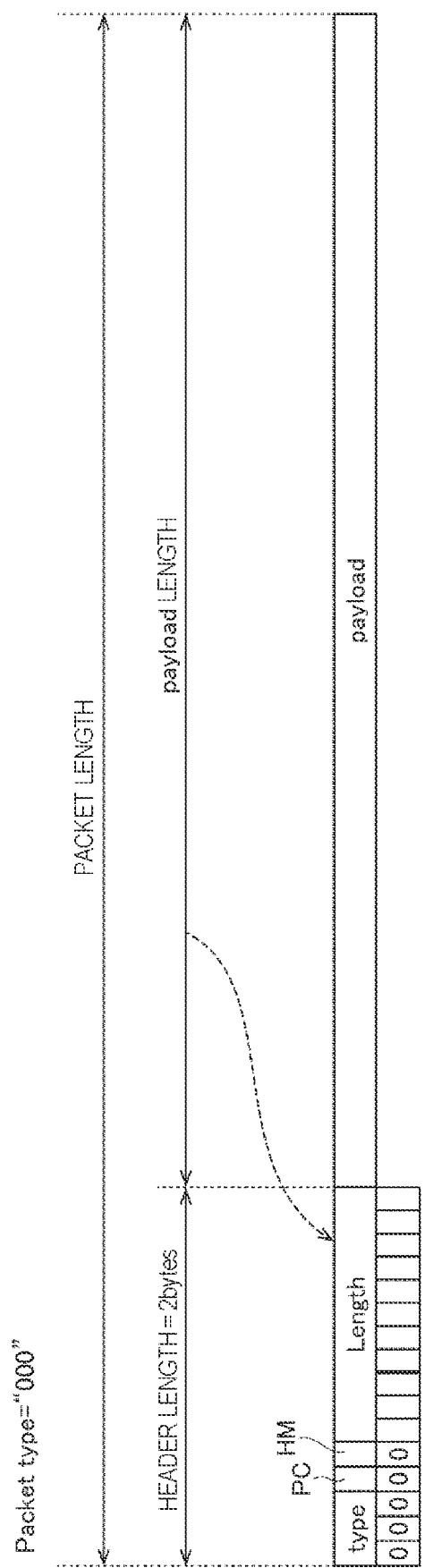
FIG. 12 is a diagram illustrating a specific structure of an ALP packet of the packet type 000.

FIG. 12 is a diagram illustrating a specific structure of the ALP packet of the packet type 000.

In FIG. 12, 0, 0, and 0 are set to 3 bits (bits described as "Type" in the drawing) of the head of the ALP packet, and thus the ALP packet is the packet type 000.

Furthermore, in the ALP packet in FIG. 12, 0 and 0 are set to 2 bits following the packet type, and thus a case where the PC of the ALP header is 0 and the HM of the ALP header is 0 is exemplified.

In this case, 11 bits including the 6th bit and the 16th bit from the head of the ALP packet (ALP header), and bits therebetween are the Length of the ALP header. A value indicated by the Length (value of the Length) represents the payload length of the ALP payload (described as "payload" in the drawing). In the ALP packet of the packet type 000, the ALP payload follows Length.

In the example of the ALP packet of the packet type 000 in FIG. 12, the header length of the ALP header is 16 bits (2 bytes) which is the sum of the bit depths of the packet type, the PC, the HM, and the Length. The payload length of the ALP payload is the value of the Length of the ALP header, and may take a value in the range of 0 to 2047 bits.

Then, the packet length of the ALP packet is a value obtained by adding the ALP header, header length, and the payload length of the ALP payload.

<Example of ALP Packet of Packet Type 100>

Figure 13:
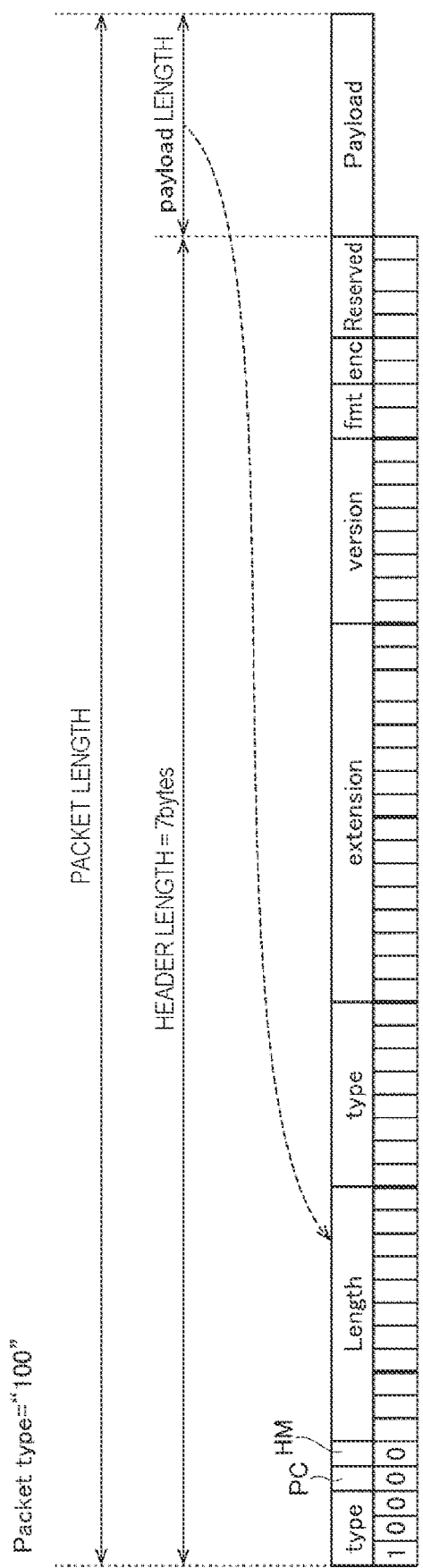
FIG. 13 is a diagram illustrating a specific structure of an ALP packet of the packet type 100.

FIG. 13 is a diagram illustrating a specific structure of the ALP packet of the packet type 100.

In FIG. 13, 1, 0, and 0 are set in 3 bits (described as "Type" in the drawing) of the head of the ALP packet, and thus the ALP packet is the packet type 100.

Furthermore, in the ALP packet in FIG. 13, 0 and 0 are set to 2 bits following the packet type, and thus a case where the PC of the ALP header is 0 and the HM of the ALP header is 0 is exemplified.

In this case, 11 bits including the 6th bit and the 16th bit from the head of the ALP packet (ALP header), and bits therebetween are the Length of the ALP header. The value of the Length represents the payload length of the ALP payload (described as "payload" in the drawing).

Furthermore, 40-bit (5-byte) Additional header for Signaling Information illustrated in FIG. 9 is arranged after the Length. In FIG. 13, the Additional header for Signaling Information includes 8-bit (1-byte) signaling_type (described as "type" in the drawing), 16-bit (2-byte) signaling type extension (described as "extension" in the drawing), 8-bit (1 byte) signaling_version (described as "version" in the drawing), 2-bit signaling_format (described as "fmt" in the drawing), 2-bit signaling encoding (described as "enc" in the drawing), and 4-bit reserved.

In the ALP packet of the packet type 100, the ALP payload follows the Additional header for Signaling Information.

In the example of the ALP packet of the packet type 100 in FIG. 13, the header length of the ALP header is 56 bits (7 bytes) which is the sum of the bit depths of the packet type, the PC, the HM, the Length, and the Additional header for Signaling Information. The payload length of the ALP payload is the value of the Length of the ALP header, and may take a value in the range of 0 to 2047 bits.

Then, the packet length of the ALP packet is a value obtained by adding the ALP header, 56 bits (7 bytes) that is the header length, and the payload length of the ALP payload.

<Problem>

The header length of the ALP header and the payload length of the ALP payload in the ALP packet can be detected on the basis of the data of the ALP header for the ALP packet of any packet type as described with reference to FIGS. 8 to 11.

To briefly describe the detection of the payload length of the ALP payload again, the ALP packet other than the packet type 111 among the valid packet types 000, 010, 100, 110, and 111 is detected by a common method according to the values of the PC, the HM, and the S/C of the ALP header regardless of the packet type.

In a case where the PC is 0 and the HM is 0, or in a case where the PC is 1 and the S/C is 0, the payload length is a value of the 11-bit Length of the ALP header (a value in the range of 0 to 2047 bits).

In a case where the PC is 0 and the HM is 1, the payload length is a value (a value in a range of 0 to 65535) indicated by data of 16 bits obtained by concatenating the 5-bit Length_MSB of the ALP header as high-order bits and the 11-bit Length of the ALP header as low-order bits.

In a case where the PC is 1 and the S/C is 1, the payload length is a value (a value in a range of 0 to 32766) indicated by data of 16 bits obtained by concatenating the 5-bit Length_MSB of the ALP header as high-order bits and the 11-bit Length of the ALP header as low-order bits.

Furthermore, for the ALP packet of the packet type 111, the payload length of the ALP payload is detected on the basis of the value of the NUMTS of the ALP header.

Note that, in the following, data obtained by concatenating the Length_MSB in the ALP header as high-order bits and the Length of the ALP header as low-order bits is referred to as extended Length.

As described above, the ATSC 3.0 standard defines that the payload length of the ALP payload is set as the Length or extended Length in the ALP header. Furthermore, the standard of ATSC 3.0 defines that a value calculated on the basis of the value of the NUMTS and a predetermined calculation formula is used as the payload length of the ALP payload.

However, depending on the transmission device 11 in FIG. 1 that generates the ALP packet, there is a case where a value different from the payload length of the ALP payload is set for the Length or extended Length or a case where an ALP packet different from the payload length calculated by the value of the NUMTS and the predetermined calculation formula is generated, due to a difference in interpretation of the ALP header in a country in which the transmission device 11 is manufactured or used, or the like. That is, in the reception device 12 in FIG. 1, as described above, the payload length detected from the data of the ALP header in accordance with the standard may be different from a true payload length.

Figure 14:
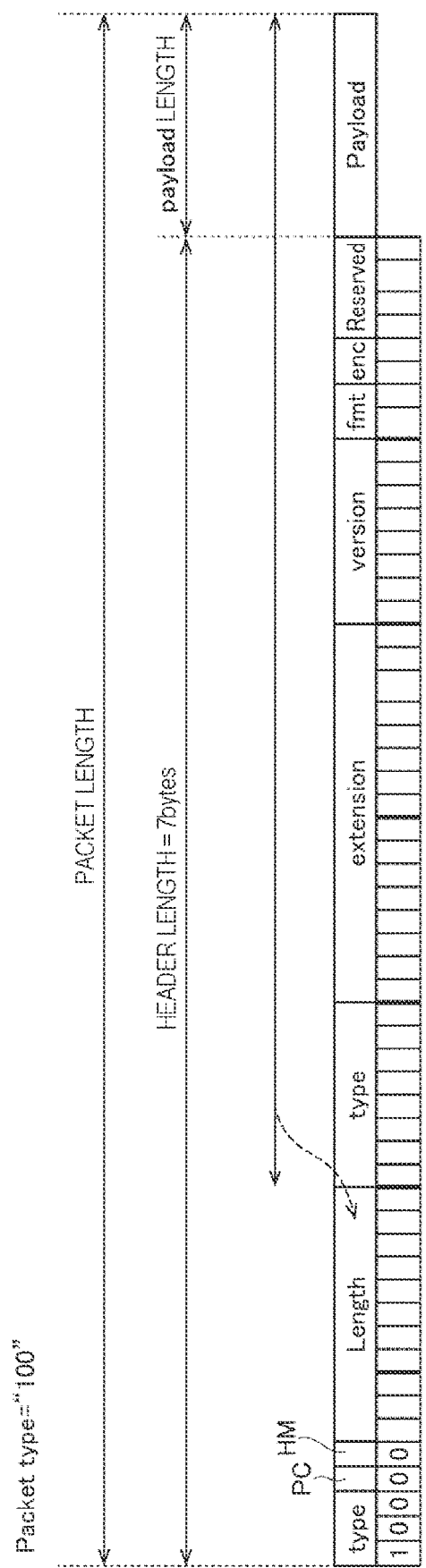
FIG. 14 is a diagram illustrating a case where the value of Length of the ALP header in the ALP packet of the packet type 100 in FIG. 13 is different from the payload length of the ALP payload.

FIG. 14 is a diagram illustrating a case where the value of the Length of the ALP header in the ALP packet of the packet type 100 in FIG. 13 is different from the payload length of the ALP payload.

Similarly to FIG. 13, the ALP packet in FIG. 14 illustrates a case where the PC of the ALP header is 0 and it is the HM0 of the ALP header in the ALP packet of the packet type 100.

In the Length of the ALP header in the ALP packet in FIG. 14, a position of a bit next to the Length, in other words, the bit depth from the head position of signaling_type (described as "Type" in the drawing) to the tail position of the ALP payload (ALP packet) is set, which is different from the case in FIG. 13.

In this case, the value of the Length is larger than, the true payload length (bit depth) of the ALP payload by an amount including the bit depth of data (Additional header for Signaling information in FIG. 9) of a part of the ALP header. In other words, the true payload length of the ALP payload is the bit depth obtained by subtracting 40 bits (5 bytes), which is the bit depth of the Additional header for Signaling Information, from the value of the Length.

If the reception device 12 detects the value of the Length of the ALP header as the payload length of the ALP payload with respect to the ALP packet in FIG. 14 in accordance with the standard as in FIG. 13, the detected payload length is larger than the actual payload length by 40 bits (5 bytes), and the packet length also is larger by 40 bits (5 bytes).

Figure 15:
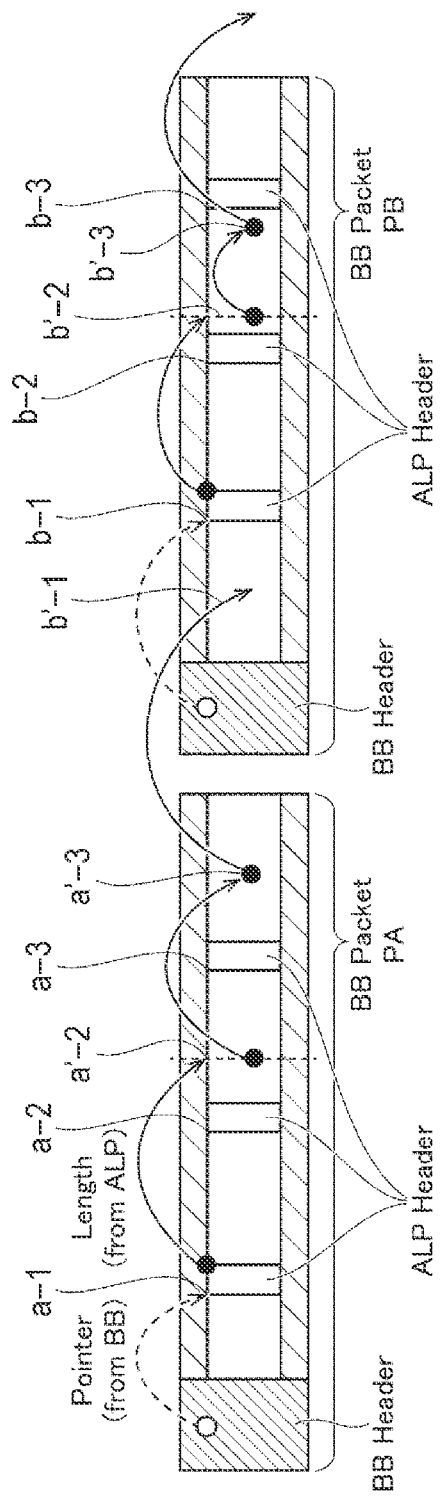
FIG. 15 is a diagram illustrating a problem that occurs in a case where a value of the Length of the ALP header is different from the payload length of the ALP payload (case in FIG. 14).

FIG. 15 is a diagram illustrating a problem that occurs in a case where the value of the Length of the ALP header is different from the payload length of the ALP payload (case in FIG. 14).

The BB packet PA and the BB packet PB in FIG. 15 are the same as the BB, packet PA and the BB packet PB in FIG. 6 except that the value of the Length of the ALP header is different from the payload length of the ALP payload.

Even in a case where the value of the Length of the ALP header is different from the true payload length of the ALP payload, the ALP head pointer of the BB header is not affected by the value of the Length of the ALP header. Thus, the BB header interpretation unit 101 correctly specifies the head position a-1 of the head ALP header on the basis of the ALP head pointer of the BB header in the BB packet RA in FIG. 15. Similarly, the ALP header interpretation unit 102 correctly specifies the head position a-1 of the head ALP header by the ALP head pointer from the BB header interpretation unit 101.

The ALP header interpretation unit 102 acquires the data of the ALP header in the head ALP packet of the BB packet PA from the transmission line 104 on the basis of the head position a-1 of the head ALP header specified by the ALP head pointer from the LB header interpretation unit 101.

Then, the ALP header interpretation unit 102 detects the header length of the ALP header and the payload length of the ALP payload in the head ALP packet on the basis of the acquired data of the ALP header, and adds the header length and the payload length to detect the packet length of the head ALP packet.

At this time, the payload length of the ALP payload that the ALP header interpretation unit 102 detects as defined on the basis of the data of the ALP header is different from the true payload length. Thus, the packet length detected by the ALP header interpretation unit 102 is also different from the true packet length.

Therefore, a head position a'-2 of the second ALP packet specified on the basis of the packet length of the head ALP packet by the ALP header interpretation unit 102 is incorrect and is different from the true head position a-2. In a case where the value of the Length of the ALP header is larger than the true payload length as in the case in FIG. 14, the head position a'-2 is shifted backward (temporally) from the true head position a-2. Furthermore, since the ALP header interpretation unit 102 supplies the ALP packet length corresponding to the head position a'-2 to the ALP extraction unit 103, the ALP extraction unit 103 also cannot specify the correct head position a-2 of the second ALP packet.

Subsequently, the ALP header interpretation unit 102 acquires data of the ALP header in the second-plane ALP packet at the specified head position a'-2, and specifies the head position a'-3 of the third ALP packet on the basis of the packet length of the second ALP packet.

At this time, since the second head position a'-2 specified by the LP header interpretation unit 102 is different from the true head position a-2, even if the second packet length is correctly detected, the ALP header interpretation unit 102 cannot correctly specify the head position a-3 of the third ALP packet.

Furthermore, since the data of the ALP header in the second ALP packet cannot be acquired from the correct position, the ALP header interpretation unit 102 cannot acquire data of the Length of the ALP header from an actual position of the Length. Therefore, the payload length detected by the ALP header interpretation unit 102 becomes an unpredictable value, and a head position a'-3 of the third ALP packet specified by the ALP header interpretation unit 102 is incorrect and is different from a true head position a'.

In other words, if the head position of the ALP packet specified by the ALP header interpretation unit 102 deviates from the true head position, thereafter, the ALP header interpretation unit 102 cannot specify the correct head position on the basis of the packet length unless the correct head position of the head ALP packet is specified by the ALP head pointer from the BB header interpretation unit 101.

As described above, in a case where the value of the Length of the ALP header is different from the true payload length of the ALP payload, the BB header interpretation unit 101 correctly specifies the head position a-1 and the head position b-1 of the head ALP packet in the BB packet PA and the BB packet PB on the basis of the ALP head pointer of the BB header.

On the other hand, the head positions a'-2, a'-3, b'-2, and b'-3 of the ALP packet specified by the ALP header interpretation unit 102 on the basis of the packet length of the ALP packet are different from the true head positions a-2, a-3, b-2, and b-3. Note that, also in a case where the head position b'-1 of the head ALP packet in the BB packet PB is specified on the basis of the packet length of the third ALP packet in the BB packet PA, the head position b'-1 is different from the true head position b-1.

Therefore, the ALP header interpretation unit 102 supplies the ALP packet length corresponding to a position different from the true head position of the ALP packet to the ALP extraction unit 103 at least other than the head position of the head ALP packet, and thus a problem occurs that the ALP extraction unit 103 cannot correctly specify the head position of the ALP packet in the BB packet and cannot appropriately extract the ALP packet.

In the above description, as a form in which the payload length detected on the basis of the data of the ALP header is different from the true payload length, the problem has been exemplified by the case where the value of the Length data of the ALP header is detected as the payload length of the ALP payload. A similar problem occurs also in a case where the value of the extended Length of the ALP header is detected as the payload length of the ALP payload and a case where the value calculated by a value of NUMTS data and the predetermined calculation formula is detected as the payload length of the ALP payload.

<Correction Process in First Embodiment of ALP Depacketizer 75>

Hereinafter, a technology for solving the problem in a case where the payload length detected on the basis of the data of the ALP header is different from the true payload length will be described.

The ALP header interpretation unit 102 in FIG. 4 has a function of adding a correction value (adding a negative correction value in a case of subtraction) of a value changeable with the detected payload length among the header length of the ALP header detected on the basis of the data of the ALP header and the payload length of the ALP payload to programmatically correct the payload length.

In other words, the ALP header interpretation unit 102 sets the correction value to be added to the payload length detected on the basis of the data of the ALP header for each of the packet type 000, the packet type 010, the packet type 100, the packet type 110, and the packet type 111 to be validly used among the packet types 000 to 111 of the ALP packet. Furthermore, the ALP header interpretation unit 102 sets the correction value for each packet type to a value designated on the basis of, for example, a user operation or the like from an operation unit that is not illustrated.

Note that the correction value for the ALP packet of the packet type 000 is represented by a correction variable $\alpha$, the correction value for the ALP packet of the packet type 010 is represented by a correction variable $\beta$, the correction value for the ALP packet of the packet type 100 is represented by a correction variable $\gamma$, the correction value for the packet type 110 is represented by a correction variable $\delta$, and the correction value for the packet type 111 is represented by a correction variable $\varepsilon$. Then, in a case where the correction value is changed, respective values of the correction variables $\alpha$, $\beta$, $\gamma$, $\delta$, and $\varepsilon$ are changed.

On the other hand, when acquiring the data of the ALP header from the transmission line 104 and specifying the head position of the next ALP header, the ALP header interpretation unit 102 detects the packet type of the ALP packet from packet type data included in the acquired data of the ALP header. Then, the ALP header interpretation unit 102 detects the header length of the ALP header with reference to necessary data from the data of the ALP header according to the detected packet type.

Note that, regarding the detection of the header length of the ALP header, the ALP header interpretation unit 102 appropriately refers to the values of the PC, the HM, the S/C, and the Count of the ALP header in addition to the packet type (Packet_Type), as described with reference to FIGS. 8 to 10, for the ALP packets of the packet type 000, the packet type 010, the packet type 100, and the packet type 110. Furthermore, for the ALP packet of the packet type 111, the ALP header interpretation unit 102 refers to the value of AHF of the ALP header in addition to the packet type as described in FIG. 11.

Furthermore, the ALP header interpretation unit 102 detects the payload length of the ALP payload with reference to necessary data from the data of the ALP header according to the detected packet type. As described above, the ALP header interpretation unit 102 detects the value of the Length or extended Length (Length and Length_MSB) of the ALP header as the payload length for the ALP packet other than the packet type 111 among the packet types 000, 010, 100, 110, and 111 to be validly used. Furthermore, the ALP header interpretation unit 102 detects (calculates) the payload length on the basis of the value of the NUMTS and the predetermined calculation formula for the ALP packet of the packet type 111.

Then, the ALP header interpretation unit 102 adds the correction variable $\alpha$, $\beta$, $\gamma$, $\delta$, or $\varepsilon$ of the value according to the packet type to the payload length of the ALP payload detected on the basis of the data of the ALP header as a correction value to correct the payload length. Note that the values of the correction variables $\alpha$, $\beta$, $\gamma$, $\delta$, and $\varepsilon$ will be described later.

With this correction of the payload length, even in a case where the payload length detected on the basis of the data of the ALP header is different from the true payload length, the payload length after the correction can be matched with the true payload length.

Then, the ALP header interpretation unit 102 detects (calculates) the packet length of the ALP packet by adding the header length of the ALP header detected on the basis of the data of the ALP header and the payload length after correction, and specifies the head position of the next ALP packet. Furthermore, the ALP header interpretation unit 102 supplies the detected ALP packet length to the ALP extraction unit 103.

<Regarding Correction Variables $\alpha$, $\beta$, $\gamma$, $\delta$, and $\varepsilon$>

The ALP header interpretation unit 102 determines the respective values of the correction variables $\alpha$, $\beta$, $\gamma$, $\delta$, and $\varepsilon$ on the basis of, for example, the user operation of the operation unit which is not illustrated. Respective settable values of the correction variables $\alpha$, $\beta$, $\gamma$, $\delta$, and $\varepsilon$ may be arbitrary values or may be limited to one or a plurality of predetermined values. Moreover, depending on the packet type, the correction variables may be fixed to predetermined values.

Note that, in a case where the value of the correction variable for the ALP packet of a certain packet type is 0, the ALP header interpretation unit 102 does not correct the payload length for the ALP packet of the packet type. In a case of the ALP packet generated in accordance with the standard, the correction is unnecessary, and thus all the correction variables $\alpha$, $\beta$, $\gamma$, $\delta$, and $\varepsilon$ are normally set to 0.

However, also in a case where the value of the correction variable is 0, it can be regarded as correction of adding 0 to the payload length detected on the basis of the data of the ALP header.

Furthermore, the ALP header interpretation unit 102 may collectively set all the values of the correction variables $\alpha$, $\beta$, $\gamma$, $\delta$, and $\varepsilon$ by a correction pattern ($\alpha$, $\beta$, $\gamma$, $\delta$, and $\varepsilon$) in which the respective values of the correction variables $\alpha$, $\beta$, $\gamma$, $\delta$, and $\varepsilon$ are combined. In this case, the ALP header interpretation unit 102 stores a plurality of correction patterns ($\alpha$, $\beta$, $\gamma$, $\delta$, and $\varepsilon$) having predetermined values. Then, the ALP header interpretation unit 102 sets, for example, values of any correction pattern among the plurality of stored correction patterns as the values of the correction variables $\alpha$, $\beta$, $\gamma$, $\delta$, and $\varepsilon$ on the basis of the user operation of the operation unit which is not illustrated.

Here, respective appropriate values of the correction variables $\alpha$, $\beta$, $\gamma$, and $\delta$ for the ALP packets of the packet type 000, the packet type 010, the packet type 100, and the packet type 110 can be determined by a difference value between a value set by the transmission device 11 in FIG. 1 as the Length or extended Length (Length and Length MSB) of the ALP header and the true payload length of the ALP payload.

Furthermore, an appropriate value of the correction variable $\varepsilon$ for the ALP packet of the packet type 111 can be determined by a difference value between the true payload length of the ALP payload in the ALP packet of the packet type 111 generated by the transmission device 11 in FIG. 1 and the payload length calculated on the basis of the value of the NUMTS and the predetermined calculation formula.

In other words, for the ALP packets of the packet type 000, the packet type 010, the packet type 100, the packet type 110, and the packet type 111, the difference value between the payload length of the ALP payload detected by the ALP header interpretation unit 102 on the basis of the data of the ALP header and the true payload length can be set as an appropriate value of the correction variable.

Note that the value of the correction variable is a positive value in a case where the payload length of the ALP payload detected on the basis of the data of the ALP header is smaller than the true payload length, and the value of the correction variable is a negative value in a case where the payload length of the ALP payload detected on the basis of the data of the ALP header is larger than the true payload length.

For example, in the example described with reference to FIGS. 14 and 15, for the ALP packet of the packet type 100, the payload length of the ALP payload detected by the ALP header interpretation unit 102 on the basis of the data of the ALP header has a value larger by 40 bits (5 bytes) than the true payload length.

Therefore, an appropriate value of the correction variable $\gamma$ for the LP packet of the packet type 100 is −40 bits (−5 bytes).

Furthermore, the examples in FIGS. 14 and 15 are based on an actual case, and according to the case, for an ALP packet of a packet type other than the packet type 100, the payload length of the ALP payload detected on the basis of data of the ALP header by the ALP header interpretation unit 102 matches the true payload length. Therefore, appropriate values of the correction variables $\alpha$, $\beta$, $\delta$, and $\varepsilon$ other than the correction variable $\gamma$ are 0.

In a case corresponding to such a case, in a mode in which the ALP header interpretation unit 102 limits values that can be set respectively in the correction variables $\alpha$, $\beta$, $\gamma$, $\delta$, and $\varepsilon$ to one or a plurality of predetermined values, 0 is included as a setting value that can be set in each of the correction variables $\alpha$, $\beta$, $\delta$, and $\varepsilon$, and 0 and −40 bits (−5 bytes) are included as values that can be set in the correction variable $\gamma$.

Furthermore, in a case of a mode in which the ALP header interpretation unit 102 sets respective values of the correction variables $\alpha$, $\beta$, $\gamma$, $\delta$, and $\varepsilon$ to any of predetermined correction patterns ($\alpha$, $\beta$, $\gamma$, $\delta$, and $\varepsilon$), the ALP header interpretation unit 102 includes a correction pattern (0, 0, 0, 0, and 0) and a correction pattern (0, 0, −40 bits (−5 bytes), 0, and 0) as settable correction patterns.

Note that appropriate values of the correction variables α, β, γ, δ, and ε are limited to some extent depending on the model and mode of the transmission device 11, the country in which the transmission device 11 and the reception device 12 are used, and the like. Therefore, it is less burdensome for the user to select an appropriate correction pattern from among a plurality of predetermined correction patterns (α, β, γ, δ, and ε) and set the selected correction pattern as the values of the correction variables α, β, γ, δ, and ε than to individually designate and set the values of the correction variables α, β, γ, δ, and ε by the user operating the operation unit.

Furthermore, a correction pattern having appropriate values as the values of the correction variables α, β, γ, δ, and ε may be applied by the user designating the model and mode of the transmission device 11, the country in which the transmission device 11 and the reception device 12 are used, and the like by operation of the operation unit. Moreover, the reception device 12 may acquire information of the model or mode of the transmission device 11, and a correction pattern having appropriate values may be automatically applied as the values of the correction variables α, β, γ, δ, and ε.

According to the first embodiment of the ALP depacketizer 75 described above, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

<Procedure of ALP Extraction Processing Performed by ALP Depacketizer 75 in FIG. 4>

Figure 16:
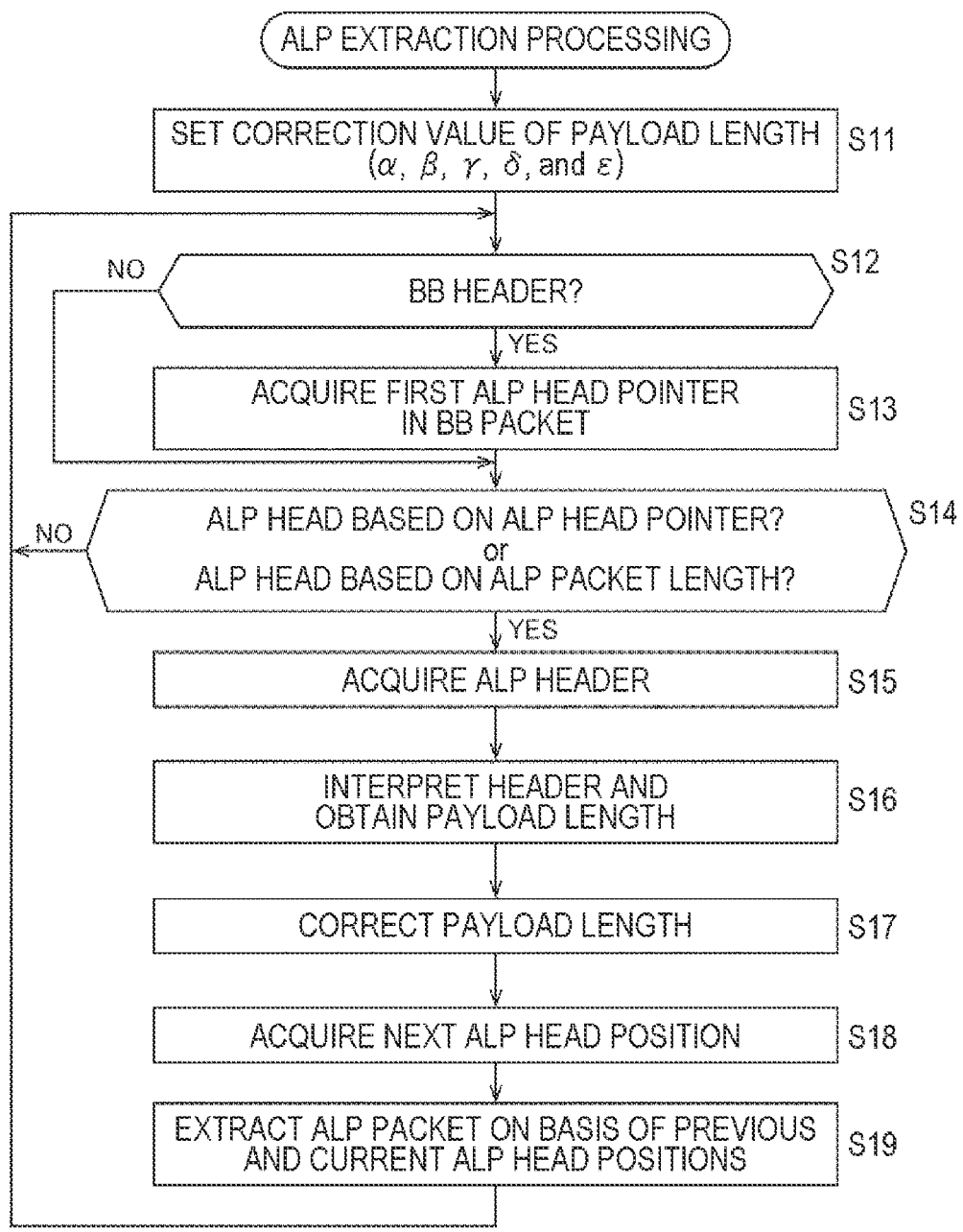
FIG. 16 is a flowchart illustrating an example of an ALP extraction processing performed by the ALP depacketizer in FIG. 4.

FIG. 16 is a flowchart illustrating an example of an ALP extraction processing performed by the ALP depacketizer 75 in FIG. 4.

In step S11, the ALP header interpretation unit 102 sets a correction value of the payload length of the ALP payload. In other words, the ALP header interpretation unit 102 sets predetermined values on the basis of the user operation of the operation unit, for example, as values of correction variables α, β, γ, δ, and ε which are respective correction values for The packet type 000, the packet type 010, the packet type 100, the packet type 110, and the packet type 111 of the ALP packet. The processing proceeds from step S11 to step S12.

In step S12, the BB header interpretation unit 101 determines whether or not the data of BB header is newly acquired from the BB packet transmitted from the SB depacketizer 74 in FIG. 3 to the ALP extraction unit 103 through the transmission line 104.

In a case where it is determined in step S12 that the data of the BB header is not newly acquired, the processing skips step S13 and proceeds to step S14.

On the other hand, in a case where it is determined in step S12 that the data of the BB header is newly acquired, the processing proceeds from step S12 to step S13.

In step S13, the BB header interpretation unit 101 acquires the ALP head pointer from the newly acquired data of the BB header, and supplies the ALP head pointer to the ALP header interpretation unit 102. The processing proceeds from step S13 to step S14.

In step S14, the ALP header interpretation unit 102 determines whether or not the data transmitted from the BB depacketizer 74 in FIG. 3 to the LLP extraction unit 103 is the head position of the ALP packet specified by the ALP head pointer from the BB header interpretation unit 101 or the head position of the ALP packet specified by the ALP packet length.

In a case where it is determined in step S14 that it is not the head position of the ALP packet, the processing returns from step S14 to step S12.

On the other hand, in a case where it is determined in step S14 that it is the head position of the ALP packet, the processing proceeds from step S14 to step S15.

In step S15, the ALP header interpretation unit 102 acquires the data of the ALP header from the transmission line 104. At this time, the ALP header interpretation unit 102 detects the packet type of the ALP packet from the data of the ALP header. The processing proceeds from step S15 to step S16.

In step S16, the ALP header interpretation unit 102 interprets the header on the basis of the data of the ALP header acquired in step S15, and detects the header length and the payload length of the ALP packet. The processing proceeds from step S16 to step S17.

In step S17, the ALP header interpretation unit 102 corrects the payload length detected in step S16. In other words, the ALP header interpretation unit 102 adds the value of the correction variable corresponding to the packet type of the ALP packet among the correction variables α, β, γ, δ, and ε for which the values are set in step S11 to the payload length detected in step S16 as the correction value. The processing proceeds from step S17 to step S18.

In step S18, the ALP header interpretation unit 102 calculates a packet length by adding the header length detected in step S16 and the payload length corrected in step S17, and specifies the head position of the next ALP packet on the basis of the calculated packet length. Furthermore, the ALP header interpretation unit 102 supplies the calculated ALP packet length to the ALP extraction unit 103. The processing proceeds from step S18 to step S19.

In step S19, the ALP extraction unit 103 specifies the head position of the next ALP packet on the basis of the ALP packet length acquired from the ALP header interpretation unit 102 in step S18.

Furthermore, the ALP packet is extracted from the BB packet on the basis of the head positions of the previous and current ALP packets.

The ALP extraction unit 103 supplies the ALP packet extracted from the BB packet to the UDP/IP depacketizer 76 (see FIG. 3) through the transmission line 105. The processing returns from step S19 to step S12, and is repeated from step S12.

According to the ALP extraction processing of the first embodiment of the ALP depacketizer 75 described above, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

<Configuration Example of Second Embodiment of ALP Depacketizer 75>

Figure 17:
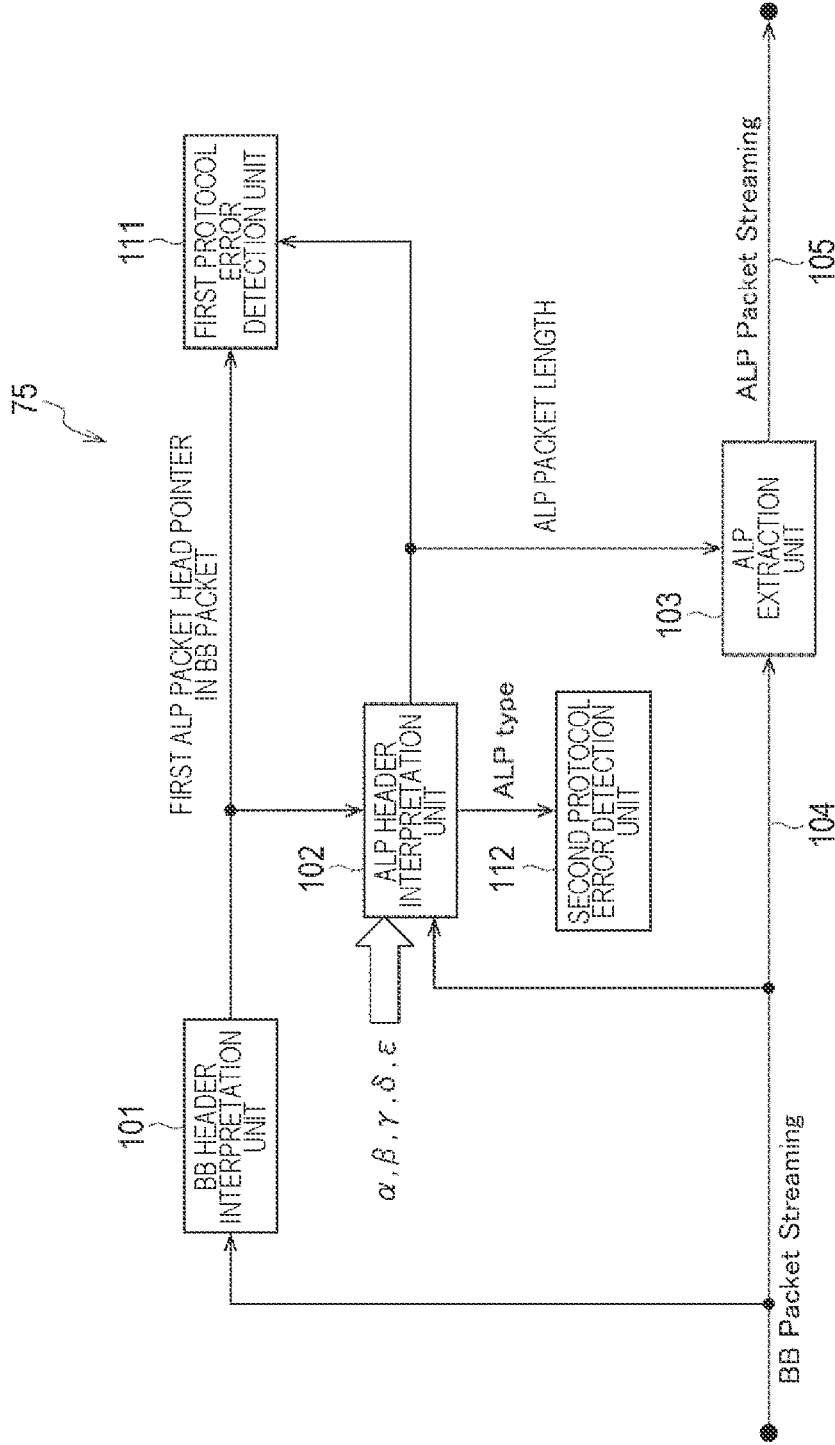
FIG. 17 is a block diagram illustrating a configuration example of a second embodiment of an ALP depacketizer.

FIG. 17 as a block diagram illustrating a configuration example of the second embodiment of the ALP depacketizer 75.

Note that, in the drawing, portions corresponding to those of the ALP depacketizer 75 in FIG. 4 are denoted by the same reference numerals, and the description thereof will be appropriately omitted.

The ALP depacketizer 75 in FIG. 17 includes the BB header interpretation unit 101, the ALP header interpretation unit 102, the ALP extraction unit 103, the transmission line 104, the transmission line 105, a first protocol error detection unit 111, and a second protocol error detection unit 112. Therefore, the ALP depacketizer 75 in FIG. 17 is common to the case in FIG. 4 in including the BB header interpretation unit 101, the ALP header interpretation unit 102, the ALP extraction unit 103, the transmission line 104, and the transmission line 105. However, the ALP depacketizer 75 in FIG. 17 is different from the case in FIG. 4 in that the first protocol error detection unit 111 and the second protocol error detection unit 112 are newly provided.

In FIG. 17, the first protocol error detection unit 111 acquires the ALP head pointer (supplied to the IP header interpretation unit 102) output by the BB header interpretation unit 101.

Furthermore, the first protocol error detection unit 111 acquires the ALP packet length (supplied to the ALP extraction unit 103) output by the ALP header interpretation unit 102.

The first protocol error detection unit 111 detects a first protocol error on the basis of a difference between the head position of the head ALP packet based on the ALP head pointer acquired from the BB header interpretation unit 101 corresponding to the head position of the head ALP packet in each BB packet and the head position of the head ALP packet based on the ALP packet length acquired from the ALP header interpretation unit 102.

Specifically, the first protocol error detection unit 111 detects the difference between the head position of the head ALP packet based on the ALP head pointer from the BB header interpretation unit 101 and the head position of the head ALP packet based on the ALP packet length from the ALP header interpretation unit 102.

Then, the first protocol error detection unit 111 determines that the first protocol error has occurred a case where the detected difference is equal to or more than a predetermined threshold, and determines that the first protocol error has not occurred in at case where the detected difference is less than the predetermined threshold. Thus, the first protocol error detection unit 111 detects the first protocol error (presence or absence of occurrence of the first protocol error).

In a case of detecting the first protocol error, the first protocol error detection unit 111 outputs a first protocol error signal to an error processing unit which is not illustrated. Processing with respect to an error performed by the error processing unit upon detecting the first protocol error signal is not limited to specific processing.

The second protocol error detection unit 112 acquires the packet type of the ALP packet detected by the ALP header interpretation unit 102 according to the data of the ALP header corresponding to the head position of each ALP packet, and detects a second protocol error on the basis of the packet type.

In other words, the second protocol error detection unit 112 determines that the second protocol error has occurred in a case where the packet type of the ALP packet detected by the ALP header interpretation unit 102 is the reserved packet type 001, packet type 011, or packet type 110 illustrated in FIG. 7, that is, the packet types that are not validly used, and determines that the second protocol error has not occurred in a case where the packet type is the packet type 000, the packet type 010, the packet type 100, the packet type 110, or the packet type 111 other than the reserved packet types. Thus, the second protocol error detection unit 112 detects the second protocol error (presence or absence of the second protocol error).

In a case of detecting the second protocol error, the second protocol error detection unit 112 outputs a second protocol error signal to the error processing unit which is not illustrated. Processing with respect to an error performed by the error processing unit upon detecting the second protocol error signal it not limited to specific processing.

Note that examples of error processing of the error processing unit may include processing of notifying the user that an error has occurred by an output unit which is not illustrated and prompting the user to change the values of the correction variables $\alpha$, $\beta$, $\gamma$, $\delta$, and $\varepsilon$, processing of stopping the ALP packet extraction processing by the ALP extraction unit 103, and the like, in a case where the first protocol error signal or the second protocol error signal is detected.

According to the second embodiment of the ALP depacketizer 75, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, in the ALP header interpretation unit 102, in a case where the values of the correction variables $\alpha$, $\beta$, $\gamma$, $\delta$, and $\varepsilon$ for correcting the payload length of the ALP payload are not appropriate, the ALP header interpretation unit 102 may not be capable of correctly acquiring the data of the ALP header. For example, in a case where the ALP header interpretation unit 102 detects a packet type from data at an incorrect position that is not the ALP header, a packet type that is not validly used may be detected. In this case, the second protocol error is detected by the second protocol error detection unit 112, and thus it is possible to detect that the ALP header interpretation unit 102 has not correctly acquired the data of the ALP header. Therefore, it is possible to detect whether or not the values of the correction variables $\alpha$, $\beta$, $\gamma$, $\delta$, and $\varepsilon$ are appropriate.

On the other hand, even in a case where the ALP header interpretation unit 102 has not correctly acquired the data of the ALP header, a valid packet type may be detected when the ALP header interpretation unit 102 detects a packet type from data at an incorrect position that is not the ALP header. In this case, the second protocol error detection unit 112 does not detect the second protocol error, and thus it is difficult to detect that the ALP header interpretation unit 102 has not correctly acquired the data of the ALP header according to the occurrence (detection) of the second protocol error.

However, in a case where such a state continues, if the ALP head pointer output from the BB header interpretation unit 101 corresponding to the head position of the head ALP packet does not match the ALP packet length output from the ALP header interpretation unit 102, the first protocol error detection unit 111 detects the first protocol error. Thus, it is possible to detect that the ALP header interpretation unit 102 has not correctly acquired the data of the ALP header according to the occurrence (detection) of the first protocol error. Therefore, it is possible to detect whether or not the values of the correction variables $\alpha$, $\beta$, $\gamma$, $\delta$, and $\varepsilon$ are appropriate.

Note that, in the second embodiment of the ALP depacketizer 75, only one of the first protocol error detection unit 111 and the second protocol error detection unit 112 may be provided, and only one of the first protocol error and the second protocol error may be detected. Even in this case, it is possible to detect whether or not the values of the correction variables $\alpha$, $\beta$, $\gamma$, $\delta$, and $\varepsilon$ are appropriate.

<Procedure of ALP Extraction Processing Performed by ALP Depacketizer 75 in FIG. 17>

Figure 18:
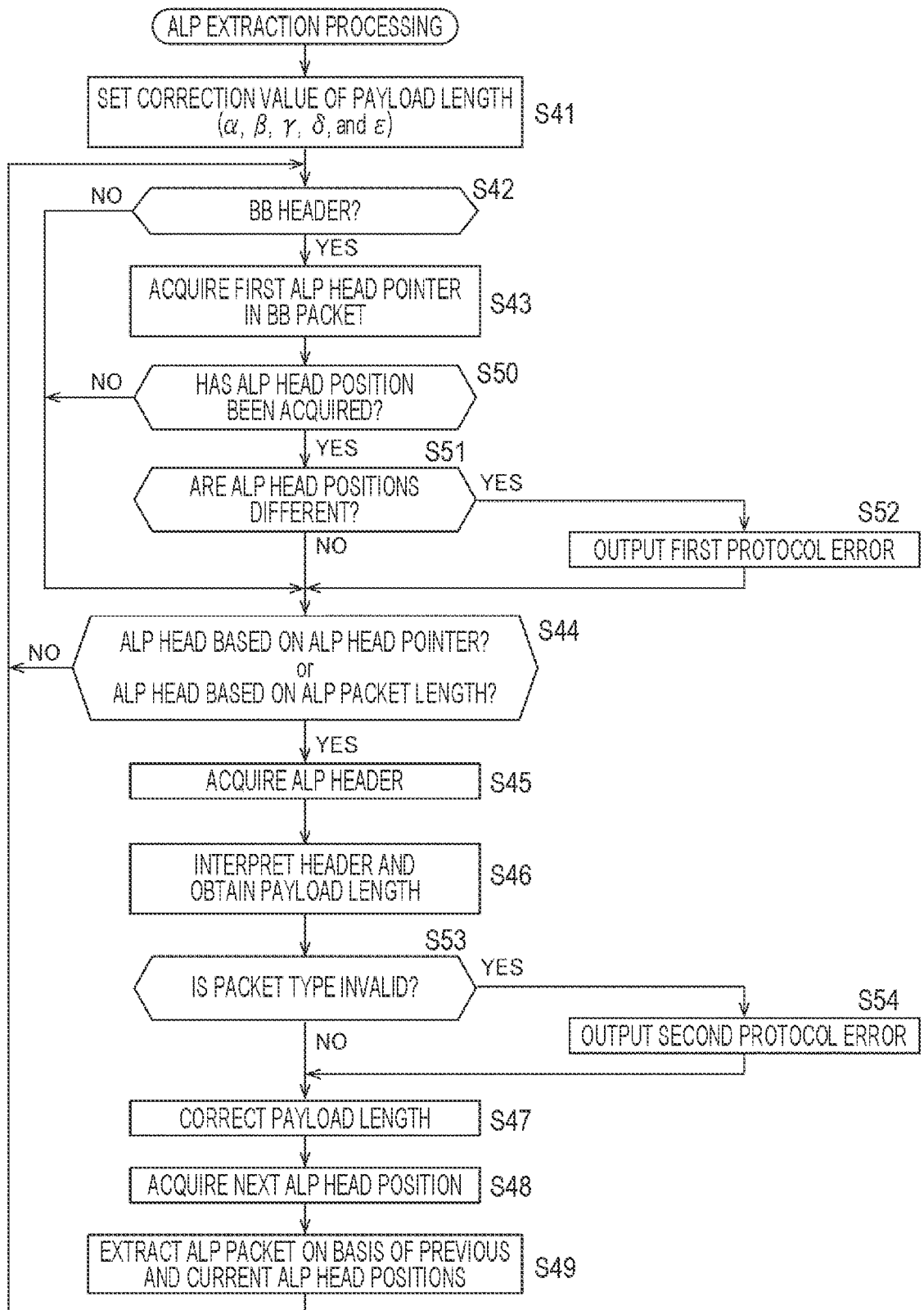
FIG. 18 is a flowchart illustrating an example of an ALP extraction processing performed by the ALP depacketizer in FIG. 17.

FIG. 18 is a flowchart illustrating an example of an ALP extraction processing performed by the ALP depacketizer 75 in FIG. 17.

Figure 19:
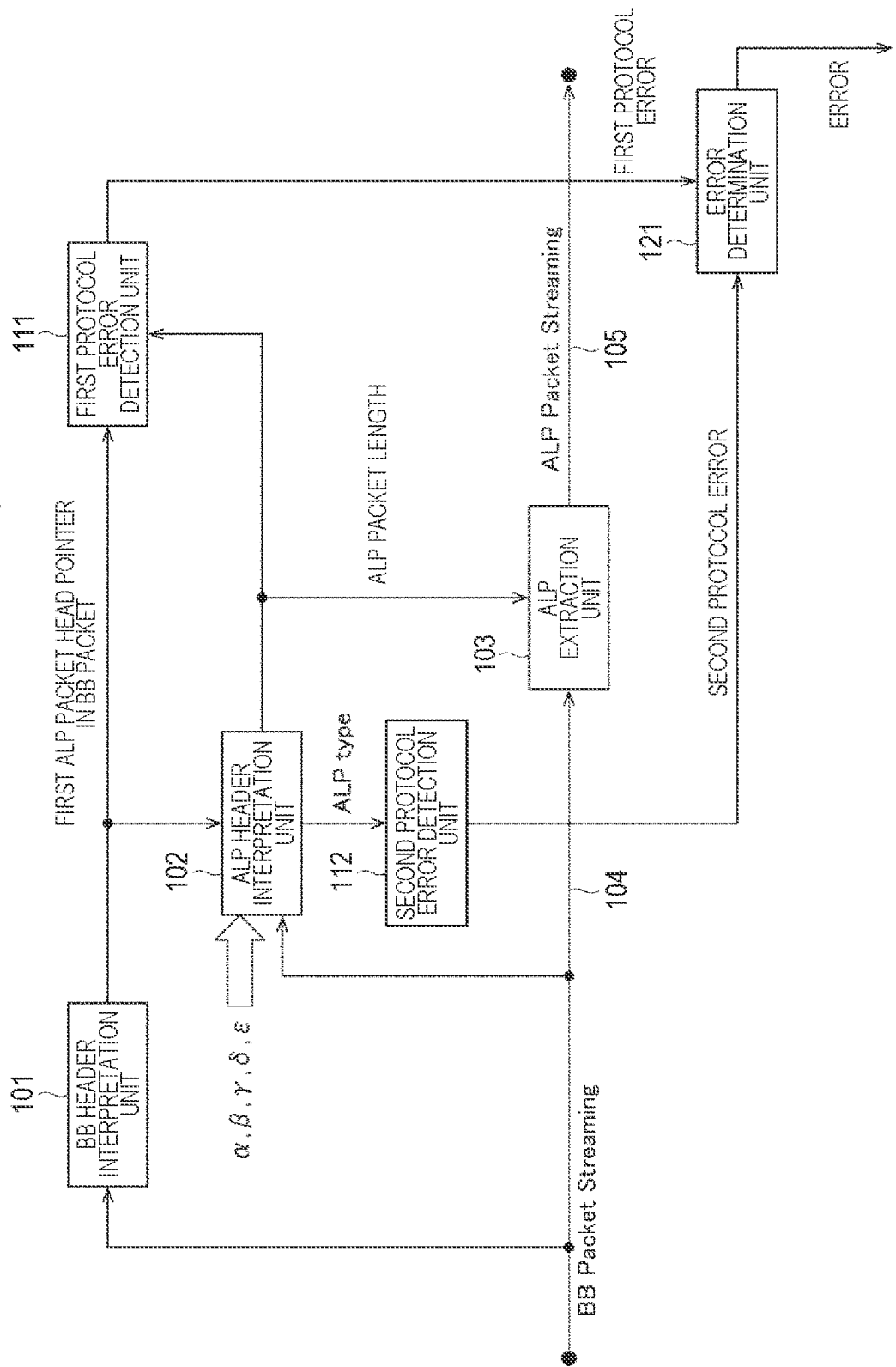
FIG. 19 is a block diagram illustrating a configuration example of a third embodiment of an ALP depacketizer.

The processing in steps S41 to S49 in FIG. 19 is common to the processing in steps S11 to S19 in FIG. 16, and thus the description thereof is omitted.

However, there are differences from steps S13 and 318 in FIG. 16 in that in step S43, the ALP head pointer output from the BB header interpretation unit 101 is supplied to the LP header interpretation unit 102 and the first protocol error detection unit 111, and in step S18, the ALP packet length output from the ALP header interpretation unit 102 is supplied to the ALP extraction unit 103 and the first protocol error detection unit 111.

In step S50, the first protocol error detection unit 111 determines whether or not the head position of the head ALP packet based on the ALP packet length from the ALP header interpretation unit 102 has been acquired.

In a case where it is determined in step S50 that the head position of the head ALP packet based on the ALP packet length has not been acquired, the processing skips steps S51 and S52 and proceeds to step S44.

In step S50, in a case where it is determined that the head position of the head ALP packet based on the ALP packet length has been acquired, the processing proceeds from step S50 to step S51.

In step S51, the first protocol error detection unit 111 determines whether or not the head position of the head ALP packet based on the ALP head pointer acquired from the BB header interpretation unit 101 and the head position of the head ALP packet based on the ALP packet length acquired from the ALP header interpretation unit 102 are different (the difference is equal to or more than a predetermined threshold).

In step S51, in a case where the difference between the head position of the head ALP packet based on the ALP head pointer and the head position of the head ALP packet based on the ALP packet length is less than the predetermined threshold, the first protocol error detection unit 111 skips step S52 and proceeds to step S44.

In step S51, in a case where the difference between the head position of the head ALP packet based on the ALP head pointer and the head position of the head ALP packet based on the ALP packet length is equal to or more than the predetermined threshold, the processing proceeds to step S52, and the first protocol error detection unit 111 supplies the first protocol error signal indicating that the first protocol error has occurred to the error processing unit which is not illustrated. The processing proceeds from step S52 to step S44.

In step S53, the second protocol error detection unit 112 determines whether or not the packet type of the ALP packet obtained by the ALP header interpretation unit 102 according to the header interpretation in step S46 is invalid.

In a case where it is determined in step S53 that the packet type is valid, the processing skips step S54 and proceeds to step S47.

In a case where it is determined in step S53 that the packet type is invalid, the processing proceeds from step S53 to step S54.

In step S54, the second protocol error detection unit 112 supplies the second protocol error signal indicating that the second protocol error has occurred to the error processing unit which is not illustrated. The processing proceeds from step S54 to step S47.

According to the ALP extraction processing of the second embodiment of the ALP depacketizer 75 described above, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, whether or not the values of the correction variables $\alpha$, $\beta$, $\gamma$, $\delta$, and $\varepsilon$ are appropriate can be detected by the first protocol error or the second protocol error.

<Configuration Example of Third Embodiment of ALP Depacketizer 75>

FIG. 19 is a block diagram illustrating a configuration example of a third embodiment of the ALP depacketizer 75.

Note that, in the drawing, portions corresponding to those of the ALP depacketizer 75 in FIG. 17 are denoted by the same reference numerals, and the description thereof will be appropriately omitted.

The ALP depacketizer 75 in FIG. 19 includes the PB header interpretation unit 101, the ALP header interpretation unit 102, the ALP extraction unit 103, the transmission line 104, the transmission line 105, the first protocol error detection unit 111, the second protocol error detection unit 112, and an error determination unit 121. Therefore, the ALP depacketizer 75 in FIG. 19 is common to the case in FIG. 17 in including the BB header interpretation unit 101, the ALP header interpretation unit 102, the ALP extraction unit 103, the transmission line 104, the transmission line 105, the first protocol error detection unit 111, and the second protocol error detection unit 112. However, the ALP depacketizer 75 in FIG. 19 is different from the case in FIG. 17 in that the error determination unit 121 is newly provided.

In FIG. 19, the error determination unit 121 acquires the first protocol error signal output from the first protocol error detection unit 111.

Furthermore, the error determination unit 121 acquires the second protocol error signal output from the second protocol error detection unit 112.

The error determination unit 121 confirms an error and outputs an error signal to the error processing unit, which is not illustrated, in a case where the first protocol error occurs predetermined n times (n is 2 or more) in succession on the basis of the first protocol error signal. Here, the fact that the first protocol error continuously occurs n times means that the first protocol error occurs every time n consecutive BB packets are transmitted to the ALP extraction unit 103.

Furthermore, on the basis of the second protocol error signal from the second protocol error detection unit 112, in a case where the second protocol error occurs even once, the error determination unit 121 confirms the error and outputs the error signal to the error processing unit which is not illustrated.

Note that examples of error processing of the error processing unit may include processing of notifying the user that an error has occurred by an output unit which is not illustrated and prompting the user to change the values of the correction variables $\alpha$, $\beta$, $\gamma$, $\delta$, and $\varepsilon$, processing of stopping the ALP packet extraction processing by the ALP extraction unit 103, and the like, in a case where the first protocol error signal or the second protocol error signal is detected.

According to the third embodiment of the ALP depacketizer 75, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, in a case where the values of the correction variables α, β, γ, δ, and ε for correcting the payload length of the ALP payload in the ALP header interpretation unit 102 are not appropriate, the ALP header interpretation unit 102 may not be capable of correctly acquiring the data of the ALP header. For example, in a case where the ALP header interpretation unit 102 detects a packet type from data at an incorrect position that is not the ALP header, a packet type that is not validly used may be detected. In this case, the second protocol error is detected by the second protocol error detection unit 112, and thus is possible to detect that the ALP header interpretation unit 102 has not correctly acquired the data of the ALP header. Therefore, it is possible to detect that the values of the correction variables α, β, γ, δ, and ε are not appropriate.

On the other hand, even in a case where the ALP header interpretation unit 102 has not correctly acquired the data of the ALP header, a valid packet type may be detected when the ALP header interpretation unit 102 detects a packet type from data at an incorrect position that is not the ALP header. In this case, the second protocol error detection unit 112 does not detect the second protocol error, and thus it is difficult to detect that the ALP header interpretation unit 102 has not correctly acquired the data of the ALP header according to the occurrence (detection) of the second protocol error.

However, in a case where such a state continues, if the head position of the head ALP packet based on the ALP head pointer from the BB header interpretation unit 101 and the head position of the head ALP packet based on the ALP packet length from the ALP header interpretation unit 102 do not match corresponding to the head position of the head ALP packet, the first protocol error detection unit 111 detects the first protocol error. Thus, it is possible to detect that the ALP header interpretation unit 102 has not correctly acquired the data of the ALP header according to the occurrence (detection) of the first protocol error. Therefore, it is possible to detect that the values of the correction variables α, β, γ, δ, and ε are not appropriate.

Furthermore, in a case where the first protocol error detection unit 111 detects the first protocol error only once, this is not necessarily due to the fact that the values of the correction variables α, β, γ, δ, and ε are not appropriate. On the other hand, in a case where the second protocol error detection unit 112 detects the second protocol error even once, there is a high possibility that the values of the correction variables α, β, γ, δ, and ε are not appropriate. Therefore, by confirming an error in a case where the first protocol error detection unit 111 continuously detects the first protocol error at least n times (n is 2 or more) or in a case where the second protocol error detection unit 112 detects the second protocol error even once, it is possible to reliably detect that the values of the correction variables α, β, γ, δ, and ε are not appropriate with high reliability.

Note that, in the third embodiment of the ALP depacketizer 75, only one of the first protocol error detection unit 111 and the second protocol error detection unit 112 may be provided and the error determination unit 121 may confirm the error by detecting one of the first protocol error and the second protocol error. Furthermore, although the error determination unit 121 confirms the error in a case where the first protocol error is detected n times (plural times) and continuously, the error determination unit 121 may confirm the error in a case where the first protocol error is detected once or in a case where the first protocol error is detected n times non-continuously, for example. Furthermore, the error determination unit 121 may confirm the error in a case where both the first protocol error and the second protocol error are detected, and the condition under which the error determination unit 121 confirms the error on the basis of the detection of the first protocol error and the detection of the second protocol error can be arbitrarily changed.

<Procedure of ALP Extraction Processing Performed by ALP Depacketizer 75 in FIG. 19>

Figure 20:
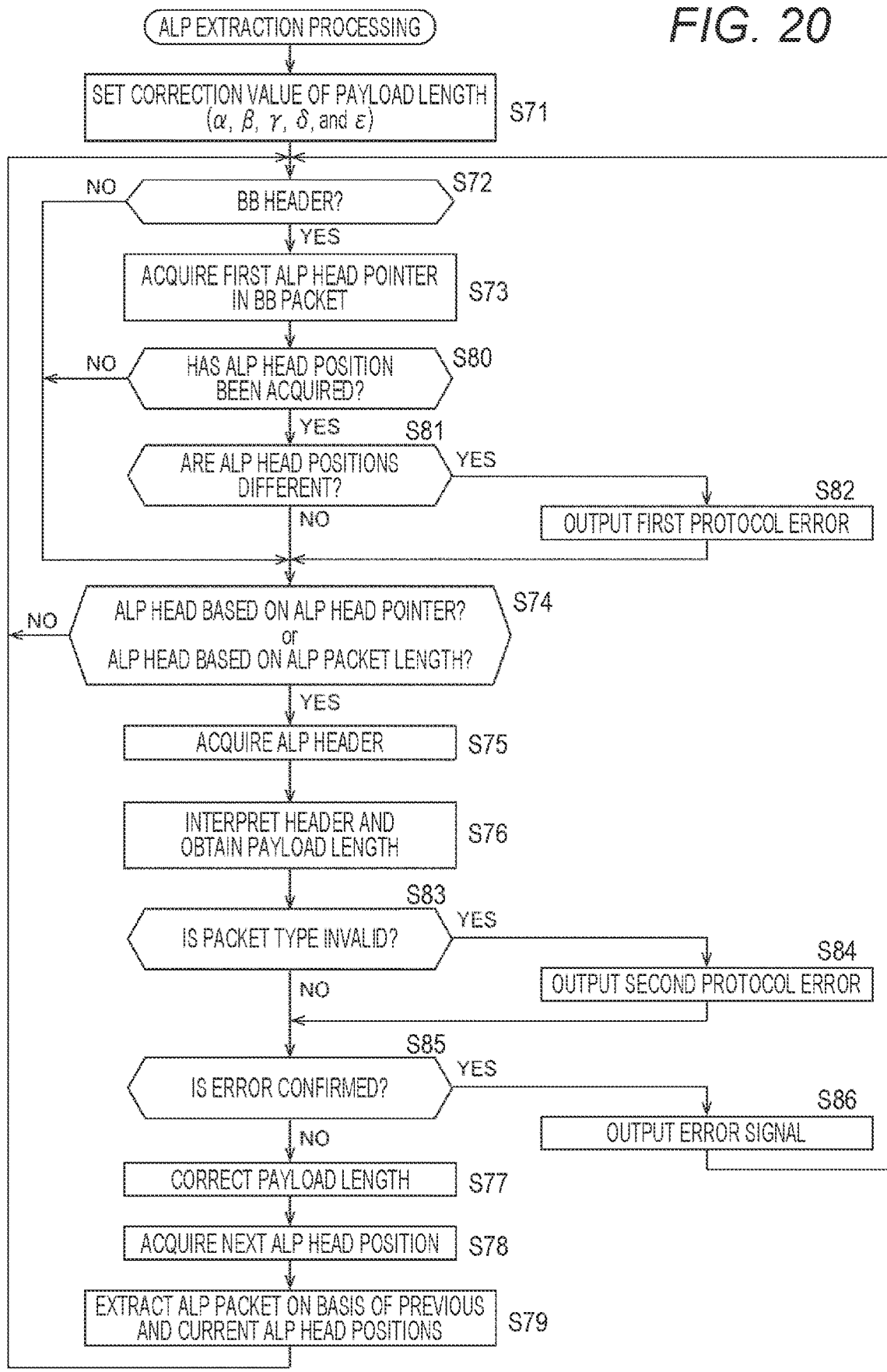
FIG. 20 is a flowchart illustrating an example of an ALP extraction processing performed by the ALP depacketizer in FIG. 19.

FIG. 20 is a flowchart illustrating an example of an ALP extraction processing performed by the ALP depacketizer 75 in FIG. 19.

The processing in steps S71 to S84 in FIG. 20 is common to the processing in steps S41 to S54 in FIG. 18, and thus the description thereof is omitted.

In step S85, the error determination unit 121 determines whether or not an error is confirmed. That is, the error determination unit 121 determines an error in a case where the first protocol error signal is output from the first protocol error detection unit 111 a predetermined plurality of times (n times) and the first protocol error signal is continuously output in step S82. The case where the first protocol error signal is continuously output is a case where the first protocol error signal is output every time the ALP head pointer is output from the RB header interpretation unit 101 (every time the BR packet that is a target changes).

Furthermore, in a case where the second protocol error signal is output even once from the second protocol error detection unit 112 in step S84, the error determination unit 121 determines an error.

In a case where it is determined in step S85 that an error has not been determined, the processing skips step S86 and proceeds from step S85 to step S77.

In a case where it is determined in step S85 that an error has been determined, the processing proceeds from step S85 to step S86.

In step 886, the error determination unit 121 outputs the error signal to the error processing unit which is not illustrated. The processing returns from step S86 to step S72, and is repeated from step S72.

According to the ALP extraction processing of the Third embodiment of the ALP depacketizer 75 described above, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, it is possible to detect with high reliability that the values of the correction variables α, β, γ, δ, and ε are not appropriate by continuously detecting the first protocol error a plurality of times or detecting the second protocol error.

<Configuration Example of Fourth Embodiment of ALP Depacketizer 75>

Figure 21:
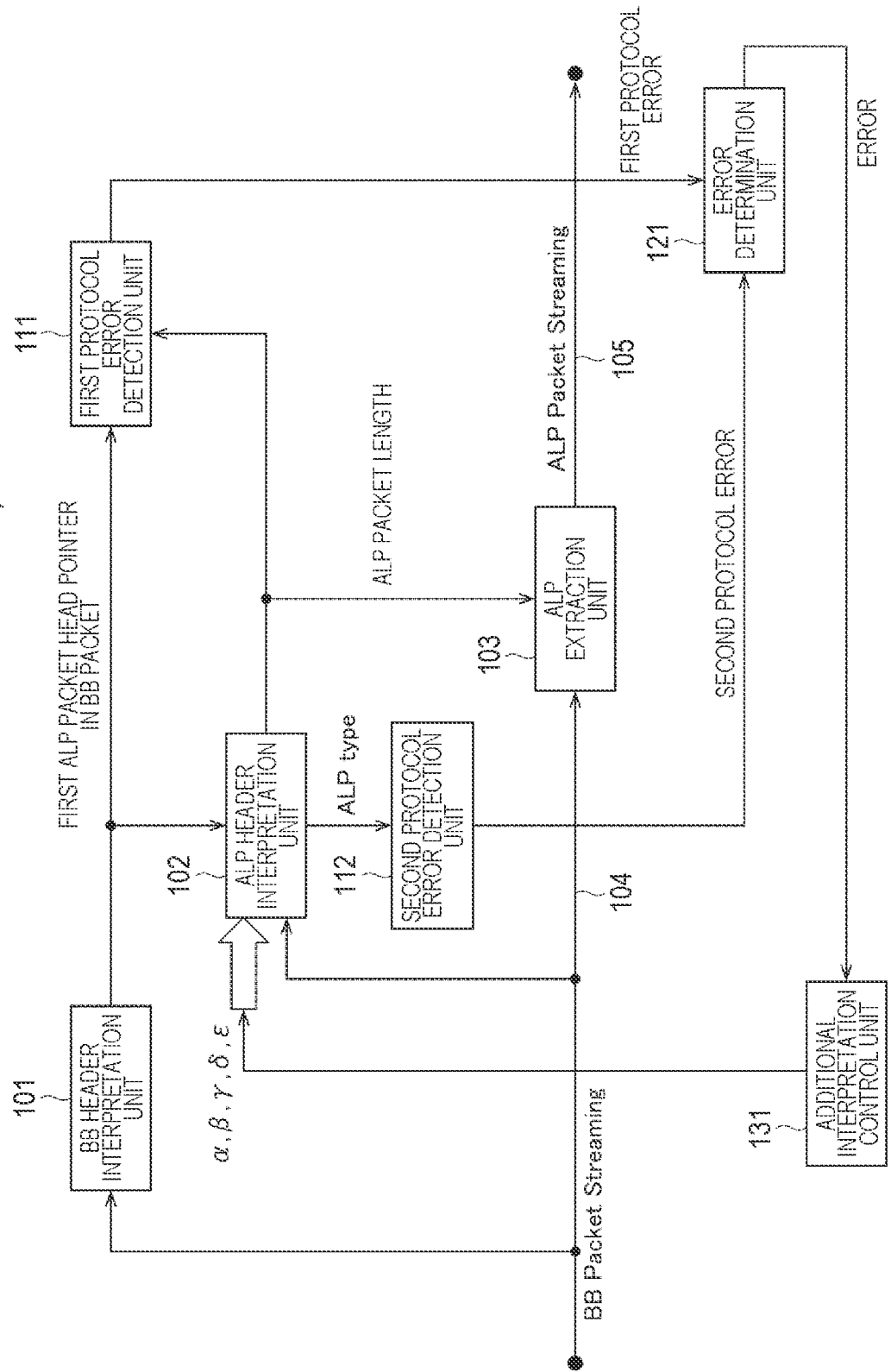
FIG. 21 is a block diagram illustrating a configuration example of a fourth embodiment of an ALP depacketizer.

FIG. 21 is a block diagram illustrating a configuration example of a fourth embodiment of the ALP depacketizer 75.

Note that, in the drawing, portions corresponding to those of the ALP depacketizer 75 in FIG. 19 are denoted by the same reference numerals, and the description thereof will be appropriately omitted.

The ALP depacketizer 75 in FIG. 21 includes the BB header interpretation unit 101, the ALP header interpretation unit 102, the ALP extraction unit 103, the transmission line 104, the transmission line 105, the first protocol error detection unit 111, the second protocol error detection unit 112, the error determination unit 121, and an additional interpretation control unit 131. Therefore, the ALP depacketizer 75 in FIG. 21 is common to the case in FIG. 19 in including the BB header interpretation unit 101, the ALP header interpretation unit 102, the ALP extraction unit 103, the transmission line 104, the transmission line 105, the first protocol error detection unit 111, the second protocol error detection unit 112, and the error determination unit 121. However, the ALP depacketizer 75 in FIG. 21 is different from the case in FIG. 19 in that the additional interpretation control unit 131 is newly provided.

In FIG. 21, the additional interpretation control unit 131 acquires the error signal output from the error determination unit 121. Then, upon acquiring the error signal from the error determination unit 121, the additional interpretation control unit 131 changes the values of the correction variables $\alpha$, $\beta$, $\gamma$, $\delta$, and $\varepsilon$, which are correction values of the payload length of the ALP payload in the ALP header interpretation unit 102.

Furthermore, the additional interpretation control unit 131 designates values to be set as the values of the correction variables $\alpha$, $\beta$, $\gamma$, $\delta$, and $\varepsilon$ with respect to the ALP header interpretation unit 102, so as to change the values of the correction variables $\alpha$, $\beta$, $\gamma$, $\delta$, and $\varepsilon$.

However, the additional interpretation control unit 131 may only instruct the ALP header interpretation unit 102 to change the values of the correction variables $\alpha$, $\beta$, $\gamma$, $\delta$, and $\varepsilon$, and the ALP header interpretation unit 102 may determine the values of the correction variables $\alpha$, $\beta$, $\gamma$, $\delta$, and $\varepsilon$ after change.

The change of the values of the correction variables $\alpha$, $\beta$, $\gamma$, $\delta$, and $\varepsilon$ in the ALP header interpretation unit 102 may be, for example, a change performed on each correction variable $\alpha$, $\beta$, $\gamma$, $\delta$, or $\varepsilon$ or collectively performed on all the values of the correction variables $\alpha$, $\beta$, $\gamma$, $\delta$, and $\varepsilon$ by a correction pattern ($\alpha$, $\beta$, $\gamma$, $\delta$, and $\varepsilon$).

Furthermore, in a case where the values of the correction variables $\alpha$, $\beta$, $\gamma$, $\delta$, and $\varepsilon$ are collectively changed by the correction pattern ($\alpha$, $\beta$, $\gamma$, $\delta$, and $\varepsilon$), a plurality of correction patterns ($\alpha$, $\beta$, $\gamma$, $\delta$, and $\varepsilon$) prepared in advance may be applied as the values of the correction variables $\alpha$, $\beta$, $\gamma$, $\delta$, and $\varepsilon$ in a predetermined order every time the error determination unit 121 outputs an error signal.

According to the fourth embodiment of the ALP depacketizer 75, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, in a case where the values of the correction variables $\alpha$, $\beta$, $\gamma$, $\delta$, and $\varepsilon$ for correcting the payload length of the ALP payload in the ALP header interpretation unit 102 are not appropriate, the ALP header interpretation unit 102 may not be capable of correctly acquiring the data of the ALP header. For example, in a case where the ALP header interpretation unit 102 detects a packet type from data at an incorrect position that is not the ALP header, a packet type that is not validly used may be detected. In this case, the second protocol error is detected by the second protocol error detection unit 112, and thus it is possible to detect that the ALP header interpretation unit 102 has not correctly acquired the data of the ALP header. Therefore, it is possible to detect whether or not the values of the correction variables $\alpha$, $\beta$, $\gamma$, $\delta$, and $\varepsilon$ are appropriate.

On the other hand, even in a case where the ALP header interpretation unit 102 has not correctly acquired the data of the ALP header, a valid packet type may be detected when the ALP header interpretation unit 102 detects a packet type from data at an incorrect position that is not the ALP header. In this case, the second protocol error detection unit 112 does not detect the second protocol error, and thus it is difficult to detect that the ALP header interpretation unit 102 has not correctly acquired the data of the ALP header according to the occurrence (detection) of the second protocol error.

However, in a case where such a state continues, if the head position of the head ALP packet indicated by the ALP head pointer output from the BB header interpretation unit 101 does not match the position of the head ALP packet based on the ALP packet length output from the ALP header interpretation unit 102, the first protocol error detection unit 111 detects the first protocol error. Thus, it is possible to detect that the ALP header interpretation unit 102 has not correctly acquired the data of the ALP header according to the occurrence (detection) of the first protocol error. Therefore, it is possible to detect whether or not the values of the correction variables $\alpha$, $\beta$, $\gamma$, $\delta$, and $\varepsilon$ are appropriate.

Furthermore, in a case where the first protocol error detection unit 111 detects the first protocol error only once, this is not necessarily due to the fact that the values of the correction variables $\alpha$, $\beta$, $\gamma$, $\delta$, and $\varepsilon$ are not appropriate. On the other hand, in a case where the second protocol error detection unit 112 detects the second protocol error even once, there is a high possibility that the values of the correction variables $\alpha$, $\beta$, $\gamma$, $\delta$, and $\varepsilon$ are not appropriate. Therefore, by confirming the error in a case where the first protocol error detection unit 111 continuously detects the first protocol error at least n times (n is 2 or more) or in a case where the second protocol error detection unit 112 detects the second protocol error even once, whether or not the values of the correction variables $\alpha$, $\beta$, $\gamma$, $\delta$, and $\varepsilon$ are appropriate can be detected with high reliability.

Furthermore, in a case where it is detected that the values of the correction variables $\alpha$, $\beta$, $\gamma$, $\delta$, and $\varepsilon$ are not appropriate, the values of the correction variables $\alpha$, $\beta$, $\gamma$, $\delta$, and $\varepsilon$ are automatically changed, so that the values of the correction variables $\alpha$, $\beta$, $\gamma$, $\delta$, and $\varepsilon$ are changed to appropriate values without labor of the user.

Note that, in the fourth embodiment of the ALP depacketizer 75, only one of the first protocol error detection unit 111 and the second protocol error detection unit 112 may be provided, and the error determination unit 121 may confirm the error by only one of the first protocol error and the second protocol error. Furthermore, although the error determination unit 121 confirms the error in a case where the first protocol error is detected n times (plural times) and continuously, the error determination unit 121 may confirm the error in a case where the first protocol error is detected once or in a case where the first protocol error is detected n times non-continuously, for example. Furthermore, the error determination unit 121 may confirm the error in a case where both the first protocol error and the second protocol error are detected, and the condition under which the error determination unit 121 confirms the error on the basis of the detection of the first protocol error and the detection of the second protocol error can be arbitrarily changed.

<Procedure of ALP Extraction Processing Performed by ALP Depacketizer 75 in FIG. 21>

Figure 22:
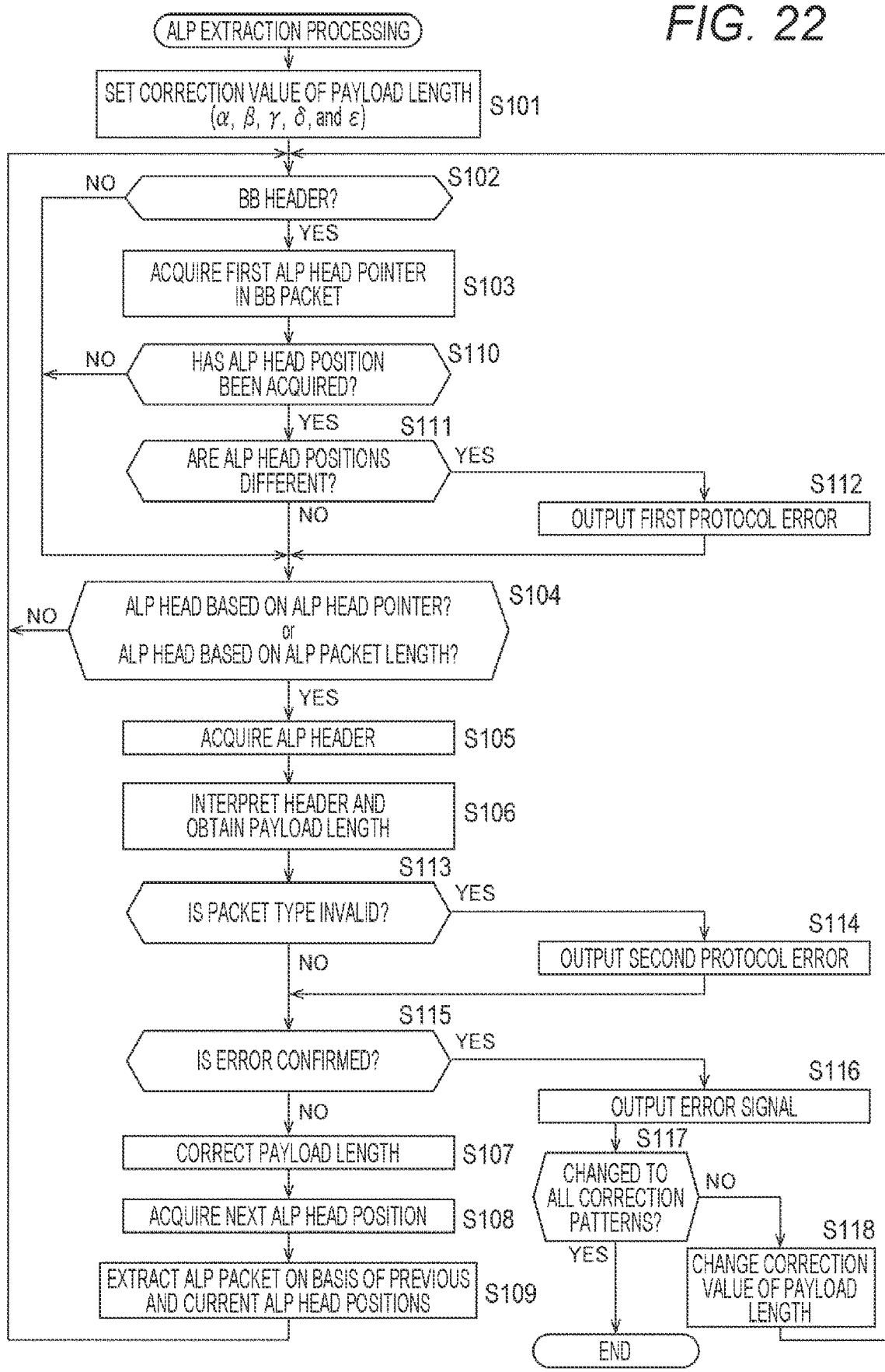
FIG. 22 is a flowchart illustrating an example of an ALP extraction processing performed by the ALP depacketizer in FIG. 21.

FIG. 22 is a flowchart illustrating an example of ALP extraction processing performed by the ALP depacketizer 75 in FIG. 21.

The processing in steps S101 to S116 in FIG. 22 is common to the processing in steps S71 to S86 in FIG. 20, and thus description thereof is omitted.

However, the error signal output from the error determination unit 121 in step S116 is different from that in step S86 in FIG. 20 in that it is supplied to the additional interpretation control unit 131.

In step S117, the additional interpretation control unit 131 determines whether or not all the correction patterns ($\alpha$, $\beta$, $\gamma$, $\delta$, and $\varepsilon$) have been applied as the values of the correction variables $\alpha$, $\beta$, $\gamma$, $\delta$, and $\varepsilon$ that are the correction values of the payload lengths in the ALP header interpretation unit 102.

In a case where it is determined in step S117 that not all the correction patterns ($\alpha$, $\beta$, $\gamma$, $\delta$, and $\varepsilon$) have been applied as the values of the correction variables $\alpha$, $\beta$, $\gamma$, $\delta$, and $\varepsilon$, the processing proceeds from step S117 to step S118.

In step S118, the additional interpretation control unit 131 changes the correction values by applying the correction pattern ($\alpha$, $\beta$, $\gamma$, $\delta$, and $\varepsilon$) that has not been applied as the values of the correction variables $\alpha$, $\beta$, $\gamma$, $\delta$, and $\varepsilon$ to the ALP header interpretation unit 102. The processing returns from step S118 to step S102, and is repeated from step S102.

On the other hand, in step S117, in a case where the additional interpretation control unit 131 determines that all the correction patterns ($\alpha$, $\beta$, $\gamma$, $\delta$, and $\varepsilon$) have been applied as the values of the correction variables $\alpha$, $\beta$, $\gamma$, $\delta$, and $\varepsilon$, the processing in this flowchart ends.

According to the ALP extraction processing of the fourth embodiment of the ALP depacketizer 75 described above, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, whether or not the values of the correction variables $\alpha$, $\beta$, $\gamma$, $\delta$, and $\varepsilon$ are appropriate can be detected with high reliability by continuously detecting the first protocol error a plurality of times or detecting the second protocol error.

Furthermore, in a case where it is detected that the values of the correction variables $\alpha$, $\beta$, $\gamma$, $\delta$, and $\varepsilon$ are not appropriate, the values of the correction variables $\alpha$, $\beta$, $\gamma$, $\delta$, and $\varepsilon$ are automatically changed, so that the values of the correction variables $\alpha$, $\beta$, $\gamma$, $\delta$, and $\varepsilon$ are changed to appropriate values without labor of the user.

<Configuration Example of Fifth Embodiment of ALP Depacketizer 75>

Figure 23:
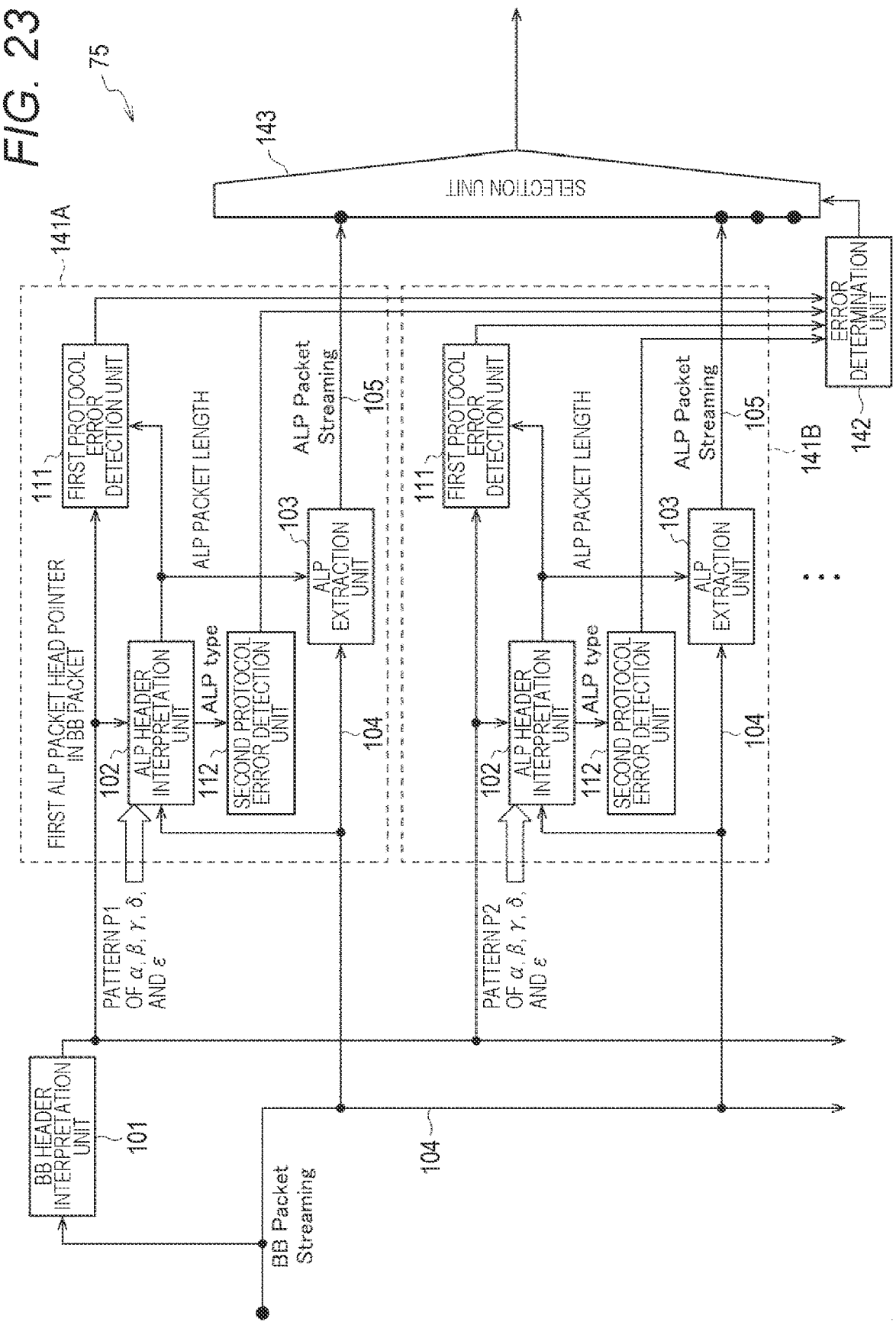
FIG. 23 is a block diagram illustrating a configuration example of a, fifth embodiment of an ALP depacketizer.

FIG. 23 is a block diagram illustrating a configuration example of a fifth embodiment of the ALP depacketizer 75.

Note that, in the drawing, portions corresponding co those of the ALP depacketizer 75 in FIG. 21 are denoted by the same reference numerals, and the description thereof will be appropriately omitted.

The ALP depacketizer 75 in FIG. 23 includes a plurality of ALP depacketizers 141A, 141B, . . . having the same configuration, and each of the ALP depacketizers 141A, 141B, includes the ALP header interpretation unit 102, the ALP extraction unit 103, the transmission line 104, the transmission line 105, the first protocol error detection unit 111, and the second protocol error detection unit 112. Furthermore, the ALP depacketizer 75 in FIG. 23 includes the BB header interpretation unit 101, an error determination unit 142, and a selection unit 143.

Therefore, the ALP depacketizer 75 in FIG. 23 is common to the case in FIG. 17 in including the BB header interpretation unit 101, the ALP header interpretation unit 102, the ALP extraction unit 103, the transmission line 104, the transmission line 105, the first protocol error detection unit 111, and the second protocol error detection unit 112. However, the ALP depacketizer 75 in FIG. 23 is different from the case in FIG. 17 in including pluralities of ALP header interpretation units 102, ALP extraction units 103, first protocol error detection units 111, and second protocol error detection units 112, and the error determination unit 142 and the selection unit 143 are newly provided.

In FIG. 23, the ALP header interpretation unit 102 and the first protocol error detection unit 111 of each of the ALP depacketizers 141A, 141B, . . . are supplied with the ALP packet length from the BB header interpretation unit 101.

Furthermore, the transmission line 104 for transmitting the BB packet is connected to the ALP extraction unit 103 of each of the ALP depacketizers 141A, 141B, . . . , and the BB packet from the BB depacketizer 74 in FIG. 3 is supplied through the transmission line 104.

Therefore, the ALP header interpretation unit 102, the ALP extraction unit 103, the first protocol error detection unit 111, and the second protocol error detection unit 112 in each of the ALP depacketizers 141A, 141B, . . . operate similarly to the ALP header interpretation unit 102, the ALP extraction unit 103, the first protocol error detection unit 111, and the second protocol error detection unit 112 in FIG. 17.

On the other hand, the error determination unit 142 acquires the first protocol error signal output from the first protocol error detection unit 111 in each of the ALP depacketizers 141A, 141B, . . . and the second protocol error signal output from the second protocol error detection unit 112 output from the second protocol error detection unit 112.

The ALP packet extracted by the ALP extraction unit 103 of each of the ALP depacketizers 141A, 141B, . . . is supplied to the selection unit 143 through the transmission line 105. The selection unit 143 selects the ALP packet from the ALP extraction unit 103 designated by the error determination unit 142 among the ALP packets transmitted from the ALP extraction unit 103 of each of the ALP depacketizers 141A, 141B, . . . , and supplies the ALP packet to the UDP/IP depacketizer 76 in FIG. 3.

In the ALP header interpretation unit 102 in each of the ALP depacketizers 141A, 141B, . . . , different values of the correction patterns P1, P2, . . . are set as the values of the correction variables $\alpha$, $\beta$, $\gamma$, $\delta$, and $\varepsilon$, respectively. Any number of ALP depacketizers 141A, 141B, . . . can be provided. Therefore, the ALP depacketizers 141A, 141B, . . . are provided as many as the number of correction patterns P1, P2, . . . that can be applied.

However, one or more of the ALP depacketizers 141A, 141B, . . . may be provided as a preliminary, and when the number of correction patterns that can be applied increases, the preliminary ALP depacketizer may be operated by setting the values of the increased correction pattern as the values of the correction variables of the ALP header interpretation unit 102 in the preliminary ALP depacketizer.

The error determination unit 142 monitors the first protocol error signal and the second protocol error signal output from the first protocol error detection unit 111 and the second protocol error detection unit 112 of each of the ALP depacketizers 141A, 141B, . . . , and detects, among the ALP depacketizers 141A, 141B, . . . , an ALP depacketizer (for example, assumed as an ALP depacketizer 141A) from which neither the first protocol error signal nor the second protocol error signal is output.

Then, the error determination unit 142 causes the selection unit 143 to select the ALP packet transmitted from the ALP extraction unit 103 of the ALP depacketizer 141A through the transmission line 105 and supply the ALP packet to the UDP/IP depacketizer 76 in FIG. 3.

Note that the ALP extraction processing by the ALP depacketizer 75 in FIG. 23 is a form of the following ALP extraction processing.

In the ALP extraction processing, a plurality of different correction values (correction patterns) is added in parallel to the payload length detected from the data of the ALP header of the ALP packet included in the BB packet from the BB depacketizer 74 in FIG. 3, and the payload length is corrected.

Then, the corrected payload length corresponding to each correction value and the header length of the ALP header are added, and the packet length of the ALP packet corresponding to each correction value is detected. Thus, the first protocol error and the second protocol error are detected using the head position of the ALP packet corresponding to each correction value specified by the packet length corresponding to each correction value and the head position of the head ALP packet specified by the IP head pointer of the BB packet.

Consequently, the correction with the correction value by which neither error is detected is assumed as valid. Thereafter, the payload length is corrected only with the valid correction value, and the ALP packet is extracted from the BB packet on the basis of the head position of the ALP packet corresponding to the correction value and the head position of the head LP packet specified by the ALP head pointer of the BB packet.

According to the fifth embodiment of the ALP depacketizer 75, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, in a case where the values of the correction variables $\alpha$, $\beta$, $\gamma$, $\delta$, and $\varepsilon$ for correcting the payload length of the ALP payload in the ALP header interpretation unit 102 are not appropriate, the ALP header interpretation unit 102 may not be capable of correctly acquiring the data of the ALP header. For example, in a case where the ALP header interpretation unit 102 detects a packet type from data at an incorrect position that is not the ALP header, a packet type that is not validly used may be detected. In this case, the second protocol error is detected by the second protocol error detection unit 112, and thus it is possible to detect that the ALP header interpretation unit 102 has not correctly acquired the data of the ALP header. Therefore, it is possible to detect whether or not the values of the correction variables $\alpha$, $\beta$, $\gamma$, $\delta$, and $\varepsilon$ are appropriate.

On the other hand, even in a case where the ALP header interpretation unit 102 has not correctly acquired the data of the ALP header, a valid packet type may be detected when the ALP header interpretation unit 102 detects a packet type from data at an incorrect position that is not the ALP header. In this case, the second protocol error detection unit 112 does not detect the second protocol error, and thus it is difficult to detect that the ALP header interpretation unit 102 has not correctly acquired the data of the ALP header according to the occurrence (detection) of the second protocol error.

However, in a case where such a state continues, if the head position of the head ALP packet indicated by the ALP head pointer output from the BB header interpretation unit 101 does not match the position of the head ALP packet based on the ALP packet length output from the ALP header interpretation unit 102, the first protocol error detection unit 111 detects the first protocol error. Thus, it is possible to detect that the ALP header interpretation unit 102 has not correctly acquired the data of the ALP header according to the occurrence (detection) of the first protocol error. Therefore, it is possible to detect whether or not the values of the correction variables $\alpha$, $\beta$, $\gamma$, $\delta$, and $\varepsilon$ are appropriate.

Furthermore, since the correction using the values (correction patterns) of the plurality of correction variables $\alpha$, $\beta$, $\gamma$, $\delta$, and $\varepsilon$ is performed in parallel, and the correction using the values of the correction variables $\alpha$, $\beta$, $\gamma$, $\delta$, and $\varepsilon$ in which no protocol error occurs becomes valid, it is not necessary to change the values of the correction variables $\alpha$, $\beta$, $\gamma$, $\delta$, and $\varepsilon$ after the protocol error occurs. Therefore, as compared with the second to fourth embodiments of the ALP depacketizer 75, appropriate extraction of the ALP packet from the BB packet can be immediately started.

Note that, in the fifth embodiment of the ALP depacketizer 75, each ALP depacketizer 141A, 141B, . . . may be provided with only one of the first protocol error detection unit 111 and the second protocol error detection unit 112, and the error determination unit 142 may detect an ALP depacketizer in which no error occurs by only one of the first protocol error and the second protocol error.

<Configuration Example of Sixth Embodiment of ALP Depacketizer 75>

Figure 24:
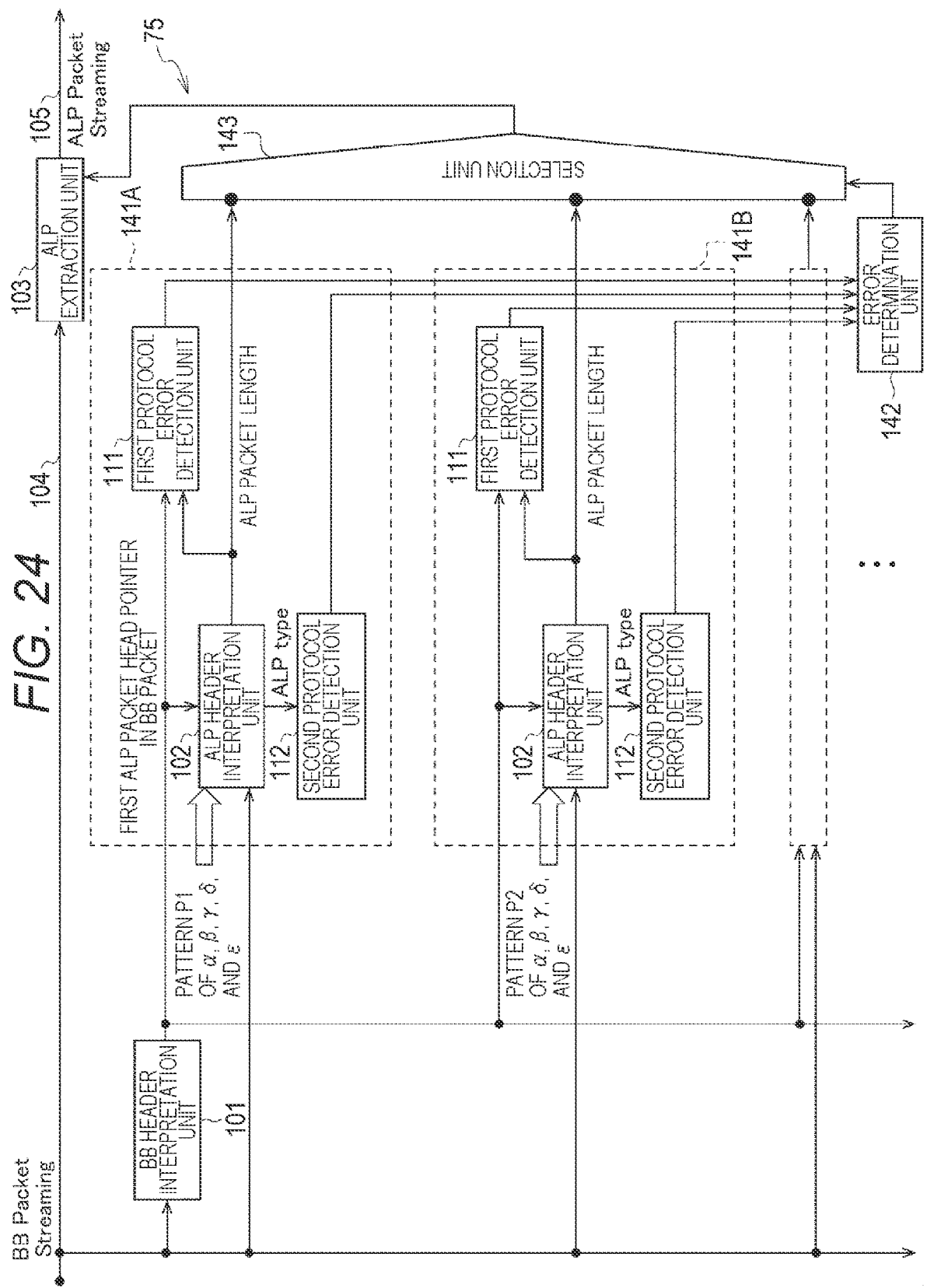
FIG. 24 is a block diagram illustrating a configuration example of a sixth embodiment of an FLP depacketizer.

FIG. 24 is a block diagram illustrating a configuration example of a sixth embodiment of the ALP depacketizer 75.

Note that, in the drawing, portions corresponding to those of the ALP depacketizer 75 in FIG. 23 are denoted by the same reference numerals, and the description thereof will be appropriately omitted.

The ALP depacketizer 75 in FIG. 24 includes a plurality of ALP depacketizers 141A, 141B, having the same configuration, and each of the ALP depacketizers 141A, 141B, includes the ALP header interpretation unit 102, the first protocol error detection unit 111, and the second protocol error detection unit 112. Furthermore, the ALP depacketizer 75 in FIG. 24 includes the BB header interpretation unit 101, the ALP extraction unit 103, the error determination unit 142, and the selection unit 143.

Therefore, the ALP depacketizer 75 in FIG. 24 is common to the case in FIG. 23 in including the plurality of ALP depacketizers 141A, 141B, . . . , the BB header interpretation unit 101, the ALP header interpretation unit 102, the ALP extraction unit 103, the transmission line 104, the transmission line 105, the first protocol error detection unit 111, the second protocol error detection unit 112, the error determination unit 142, and the selection unit 143.

However, the ALP depacketizer 75 in FIG. 24 is different from the case in FIG. 23 in that the LP depacketizers 141A, 141B, do not include the ALP extraction unit 103, the transmission line 104, and the transmission line 105, that the ALP packet length from the ALP header interpretation unit 102 of each of the LP depacketizers 141A and 141B is supplied to the selection unit 143, and that the ALP packet length is supplied from the selection unit 143 to the ALP extraction unit 103.

In FIG. 24, the ALP extraction unit 103 is not included in each of the ALP depacketizers 141A, 141B, . . . , and only one ALP depacketizer 75 is provided. The BB packet from the BB depacketizer 74 in FIG. 3 is transmitted to the ALP extraction unit 103 through the transmission line 104. Furthermore, from the ALP extraction unit 103, the ALP packet extracted by the ALP extraction unit 103 is transmitted to the UDP/IP depacketizer 76 in FIG. 3 through the transmission line 105.

The selection unit 143 selects the ALP packet length from the ALP header interpretation unit 102 of the ALP depacketizers 141A and 141B designated by the error determination unit 142 from the ALP packet lengths supplied from the ALP header interpretation unit 102 of each of the ALP depacketizers 141A and 141B, . . . and supplies the selected ALP packet length to the ALP extraction unit 103.

That is, the error determination unit 142 monitors the first protocol error signal and the second protocol error signal output from the first protocol error detection unit 111 and the second protocol error detection unit 112 of each of the ALP depacketizers 141A, 141B, . . . , and detects, among the ALP depacketizers 141A, 141B, . . . , an ALP depacketizer (for example, referred to as an ALP depacketizer 141A) from which neither the first protocol error signal nor the second protocol error signal is output.

Then, the error determination unit 142 designates the detected ALP depacketizer (ALP depacketizer 141A) to the selection unit 143. The selection unit 143 selects the ALP packet length supplied from the ALP header interpretation unit 102 of the ALP depacketizer 141A designated by the error determination unit 142, and supplies the ALP packet length to the ALP extraction unit 103.

The ALP extraction unit 103 extracts the ALP packet from the BB packet transmitted on the transmission line 104 on the basis of the ALP packet length from the selection unit 143, and supplies the extracted ALP packet to the UDP/IP depacketizer 76 in FIG. 3 via the transmission line 105.

Note that the ALP extraction processing by the ALP depacketizer 75 in FIG. 24 is a form of the following ALP extraction processing as in FIG. 23.

In the ALP extraction processing, a plurality of different correction values (correction patterns) is added in parallel to the payload length detected from the data of the ALP header of the ALP packet included in the BB packet from the BB depacketizer 74 in FIG. 3, and the payload length is corrected.

Then, the corrected payload length corresponding to each correction value and the header length of the ALP header are added, and the packet length of the ALP packet corresponding to each correction value is detected. Thus, the first protocol error and the second protocol error are detected using the head position of the ALP packet corresponding to each correction value specified by the packet length corresponding to each correction value and the head position of the head ALP packet specified by the ALP head pointer of the BB packet.

Consequently, the correction with the correction value by which neither error is detected is assumed as valid. Thereafter, the payload length is corrected only by the valid correction value, and the ALP packet is extracted from the BB packet on the basis of the head position of the ALP packet corresponding to the correction value.

According to the sixth embodiment of the ALP depacketizer 75, since the payload length of the ALP payload detected on the basis of the data of the ALP header in the ALP packet stored in the BB packet can be corrected, the ALP packet can be appropriately extracted from the BB packet even with the ALP header different from the interpretation conforming to the standard.

Furthermore, in a case where the values of the correction variables $\alpha$, $\beta$, $\gamma$, $\delta$, and $\varepsilon$ for correcting the payload length of the ALP payload in the ALP header interpretation unit 102 are not appropriate, the ALP header interpretation unit 102 may not be capable of correctly acquiring the data of the ALP header. For example, in a case where the ALP header interpretation unit 102 detects a packet type from data at an incorrect position that is not the ALP header, a packet type that is not validly used may be detected. In this case, the second protocol error is detected by the second protocol error detection unit 112, and thus it is possible to detect that the ALP header interpretation unit 102 has not correctly acquired the data of the ALP header, Therefore, it is possible to detect whether or not the values of the correction variables $\alpha$, $\beta$, $\gamma$, $\delta$, and $\varepsilon$ are appropriate.

On the other hand, even in a case where the ALP header interpretation unit 102 has not correctly acquired the data of the ALP header, a valid packet type may be detected when the ALP header interpretation unit 102 detects a packet type from data at an incorrect position that is not the ALP header. In this case, the second protocol error detection unit 112 does not detect the second protocol error, and thus it is difficult to detect that the ALP header interpretation unit 102 has not correctly acquired the data of the ALP header according to the occurrence (detection) of the second protocol error.

However, in a case where such a state continues, if the head position of the head ALP packet indicated by the ALP head pointer output from the BB header interpretation unit 101 does not match the position of the head ALP packet based on the ALP packet length output from the ALP header interpretation unit 102, the first protocol error detection unit 111 detects the first protocol error. Thus, it is possible to detect that the ALP header interpretation unit 102 has not correctly acquired the data of the ALP header according to the occurrence (detection) of the first protocol error. Therefore, it is possible to detect whether or not the values of the correction variables $\alpha$, $\beta$, $\gamma$, $\delta$, and $\varepsilon$ are appropriate.

Furthermore, since the correction using the values (correction patterns) of the plurality of correction variables $\alpha$, $\beta$, $\gamma$, $\delta$, and $\varepsilon$ is performed in parallel, and the correction using the values of the correction variables $\alpha$, $\beta$, $\gamma$, $\delta$, and $\varepsilon$ in which no protocol error occurs becomes valid, it is not necessary to change the values of the correction variables $\alpha$, $\beta$, $\gamma$, $\delta$, and $\varepsilon$ after the protocol error occurs. Therefore, the sixth embodiment of the ALP depacketizer 75 can immediately start appropriate extraction of the ALP packet from the BB packet as compared with the second to fourth embodiments of the ALP depacketizer 75.

Moreover, since there is one ALP extraction unit 103, the sixth embodiment of the ALP depacketizer 75 has an advantage that the circuit scale (RAM or the like) can be reduced as compared with the fifth embodiment.

Note that, in the sixth embodiment of the ALP depacketizer 75, each ALP depacketizer 141A, 141B, . . . may be provided with only one of the first protocol error detection unit 111 and the second protocol error detection unit 112, and the error determination unit 142 may detect an ALP depacketizer in which no error occurs by only one of the first protocol error and the second protocol error.

The present technology is not limited to the information processing device or the like conforming to the broadcast standard of ATSC 3.0, and can be applied as a technology of extracting a second packet from a first packet in a case where the second packet is included in the first packet and transmitted.

The first packet and the second packet satisfy the following conditions.

The first packet includes a header and a payload, and includes the second packet in the payload. The header includes information related to a joint of the included second packet.

The second packet includes a header and a payload, and the header includes information regarding a payload length.

The BB packet in the embodiment corresponds to the first packet, and the ALP packet corresponds to the second packet. Note that the above conditions of the first packet and the second packet are merely examples, and are not necessarily essential conditions for applying the present technology.

<Program>

A series of processes of the ALP depacketizer 75 described above can be executed by hardware or software. In a case where the series of processes is executed by software, a program constituting the software is installed in a computer. Here, the computer includes a computer incorporated in dedicated hardware, a general-purpose personal computer for example that can execute various functions by installing various programs, and the like.

Figure 25:
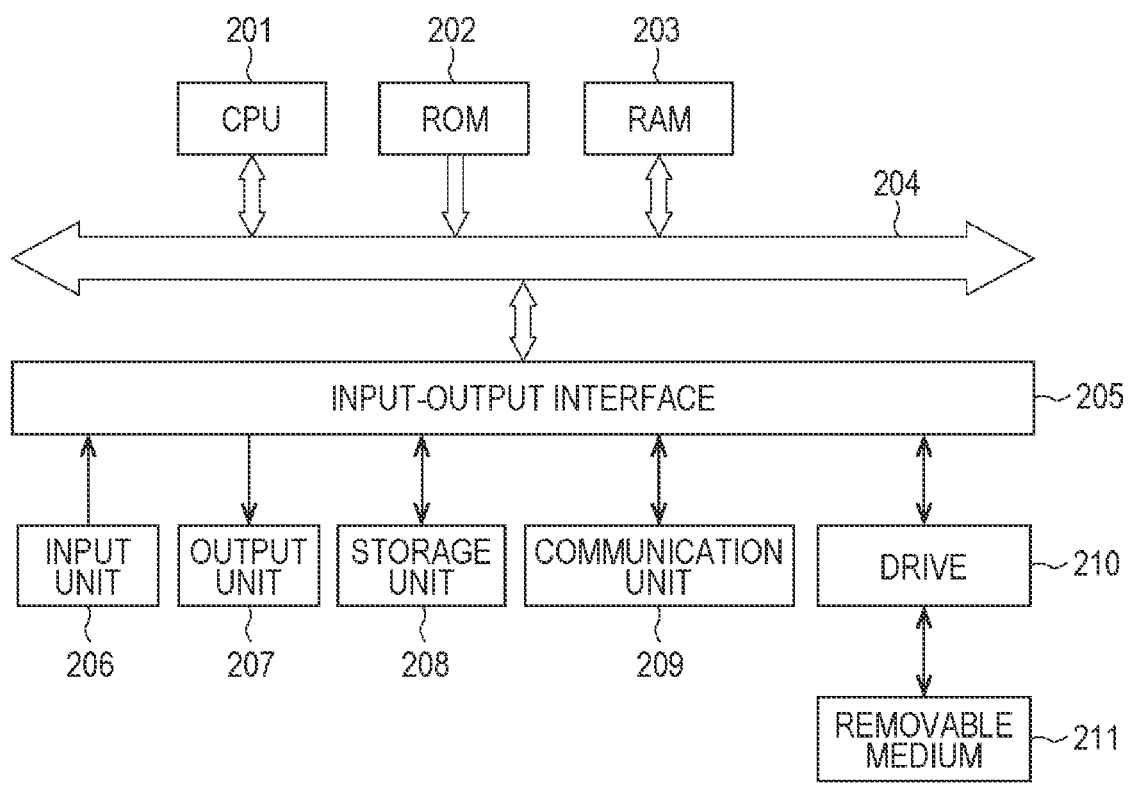
FIG. 25 is a block diagram illustrating a configuration example of hardware of a computer that executes a series of processes by a program.

FIG. 25 is a block diagram illustrating a configuration example of hardware of a computer that executes the above-described series of processes by a program.

In the computer, a central processing unit (CPU) 201, a read only memory (RUM) 202, and a random access memory (PAM) 203 are mutually connected by a bus 204.

An input-output interface 205 is further connected to the bus 204. An input unit 206, an output unit 207, a storage unit 208, a communication unit 209, and a drive 210 are connected to the input-output interface 205.

The input unit 206 includes a keyboard, a mouse, a microphone, and the like. The output unit 207 includes a display, a speaker, and the like. The storage unit 208 includes a hard disk, a nonvolatile memory, and the like. The communication unit 209 includes a network interface and the like. The drive 210 drives a removable medium 211 such as a magnetic disk, an optical disk, a magneto-optical disk, or a semiconductor memory.

In the computer configured as described above, for example, the CPU 201 loads the program stored in the storage unit 208 into the RAM 203 via the input-output interface 205 and the bus 204 and executes the program, to thereby perform the above-described series of processes.

The program executed by the computer (CPU 201) can be provided by being recorded in the removable medium 211 as a package medium or the like, for example. Furthermore, the program can be provided via a wired or wireless transmission medium such as a local area network, the Internet, or digital satellite broadcasting.

In the computer, the program can be installed in the storage unit 208 via the input-output interface 205 by mounting the removable medium 211 to the drive 210. Furthermore, the program can be received by the communication unit 209 via a wired or wireless transmission medium and installed in the storage unit 208. In addition, the program can be installed in the ROM 202 or the storage unit 208 in advance.

Note that the program executed by the computer may be a program for processing in time series in the order described in the present description, or a program for processing in parallel or at a necessary timing such as when a call is made.

Note that the present technology can have configurations as follows.

<1> An information processing device including
a processing unit that performs correction on a payload length obtained on the basis of data of headers of second packets included in a first packet.

<2> The information processing device according to <1>, in which
the processing unit performs the correction by adding a predetermined correction value to the payload length.

<3> The information processing device according to <2>, in which
the correction value is changeable.

<4> The information processing device according to <2> or <3>, in which
the processing unit sets the correction value to a value for each packet type of the second packets.

<5> The information processing device according to <4>, in which
the processing unit sets, by a correction pattern combining correction values for each packet type of the second packets, the correction value to the value for the each packet type.

<6> The information processing device according to any one of <1> to <5>, in which
the processing unit calculates a packet length of the second packets by using a header length of the headers of the second packets and the payload length after performing the correction.

<7> The information processing device according to <6>, in which
the processing unit detects a first protocol error based on a difference between a head position of the second packet at a head specified by data of a header of the first packet and the head position of the second packet at the head specified by the packet length of the second packet immediately before the second packet at the head, among the second packets stored in the first packet.

<8> The information processing device according to <6>, in which
the processing unit detects a second protocol error based on a packet type detected with data from a head position of the second packet that is next specified by the packet length of the second packet.

<9> The information processing device according to <6>, in which
the processing unit detects
a first protocol error based on a difference between a head position of the second packet at a head specified by data of a header of the first packet and the head position of the second packet at the head specified by the packet length of the second packet immediately before the second packet at the head, among the second packets stored in the first packet, and
a second protocol error based on a packet type detected by data from a head position of the second packet that is next specified by the packet length of the second packet.

<10> The information processing device according to <9>, in which
the processing unit determines an error on the basis of the detection of the first protocol error and the detection of the second protocol error.

<11> The information processing device according to <9>, in which the processing unit confirms an error in a case where the first protocol error is detected a plurality of times determined in advance and every time the first packet that is a target changes, or in a case where a second protocol error is detected based on a packet type detected by data from the head position of the second packet that is next specified by the packet length of the second packet.

<12> The information processing device according to <10> or <11>, in which the processing unit performs the correction by adding a predetermined correction value to the payload length, and changes the correction value in a case where the error is confirmed.

<13> The information processing device according to <7>, in which the processing unit performs the correction by adding a predetermined correction value to the payload length, and changes the correction value in a case where the first protocol error is detected.

<14> The information processing device according to <8>, in which the processing unit performs the correction by adding a predetermined correction value to the payload length, and changes the correction value in a case where the second protocol error is detected.

<15> The information processing device according to <9>, in which the correction is performed by adding a predetermined correction value to the payload length, and the payload length is corrected with a plurality of the correction values that is different, and the correction with a correction value with which the first protocol error and the second protocol error are not detected is validated.

<16> The information processing device according to <7>, in which the correction is performed by adding a predetermined correction value to the payload length, and the payload length is corrected with a plurality of the correction values that is different, and the correction with a correction value with which the first protocol error is not detected is validated.

<17> The information processing device according to <8>, in which the correction is performed by adding a predetermined correction value to the payload length, and the payload length is corrected with a plurality of the correction values that is different, and the correction with a correction value with which the second protocol error is not detected is validated.

<18> The information processing device according to any one of <6> to <17>, in which the processing unit extracts the second packet stored in the first packet from the first packet on the basis of a head position of the second packet that is next specified by the packet length of the second packet.

<19> An information processing method including, in an information processing device having a processing unit, correcting, by the processing unit, a payload length obtained on the basis of data of headers of second packets included in a first packet.

<20> A program for causing a computer to function as a processing unit that performs correction on a payload length obtained on the basis of data of headers of second packets included in a first packet.

REFERENCE SIGNS LIST

1 Transmission system
11 Transmission device
12 Reception device
75, 141A, 141B ALP depacketizer
101 BE header interpretation unit
102 ALP header interpretation unit
103 ALP extraction unit
111 First protocol error detection unit
112 Second protocol error detection unit
121 Error determination unit
131 Additional interpretation unit

The invention claimed is:

1. An information processing device comprising:
a memory storing instructions, and
at least one processor configured to execute the instructions to perform operations comprising:
performing correction on a payload length obtained on a basis of data of headers of second packets included in a first packet;
calculating a packet length of the second packets by using a header length of the headers of the second packets and the payload length after performing the correction; and
detecting a first protocol error based on a difference between a head position of the second packet at a head specified by data of a header of the first packet and the head position of the second packet at the head specified by the packet length of the second packet immediately before the second packet at the head, among the second packets included in the first packet.

2. The information processing device according to claim 1, wherein the operations further comprise:
performing the correction by adding a predetermined correction value to the payload length.

3. The information processing device according to claim 2, wherein the correction value is changeable.

4. The information processing device according to claim 2, wherein the operations further comprise:
setting the correction value to a value for each packet type of the second packets.

5. The information processing device according to claim 4, wherein the operations further comprise:
setting, by a correction pattern combining correction values for each packet type of the second packets, the correction value to the value for the each packet type.

6. An information processing device comprising:
a memory storing instructions, and
at least one processor configured to execute the instructions to perform operations comprising:
performing correction on a payload length obtained on a basis of data of headers of second packets included in a first packet;
calculating a packet length of the second packets by using a header length of the headers of the second packets and the payload length after performing the correction; and
detecting detects a second protocol error based on a packet type detected with data from a head position of the second packet that is next specified by the packet length of the second packet.

7. An information processing device comprising:
a memory storing instructions, and
at least one processor configured to execute the instructions to perform operations comprising:
performing correction on a payload length obtained on a basis of data of headers of second packets included in a first packet;

calculating a packet length of the second packets by using a header length of the headers of the second packets and the payload length after performing the correction;

detecting a first protocol error based on a difference between a head position of the second packet at a head specified by data of a header of the first packet and the head position of the second packet at the head specified by the packet length of the second packet immediately before the second packet at the head, among the second packets included in the second packet; and detecting a second protocol error based on a packet type detected by data from a head position of the second packet that is next specified by the packet length of the second packet.

8. The information processing device according to claim 7, wherein the operations further comprise:

determining an error on a basis of the detection of the first protocol error and the detection of the second protocol error.

9. The information processing device according to claim 7, wherein the operations further comprise:

confirming an error in a case where the first protocol error is detected a plurality of times determined in advance and every time the first packet that is a target changes, or in a case where a second protocol error is detected based on a packet type detected by data from the head position of the second packet that is next specified by the packet length of the second packet.

10. The information processing device according to claim 8, wherein where operations further comprise:

performing the correction by adding a predetermined correction value to the payload length, and changes the correction value in a case where the error is confirmed.

11. The information processing device according to claim 1, wherein the operations further comprise:

performing the correction by adding a predetermined correction value to the payload length, and changing the correction value in a case where the first protocol error is detected.

12. The information processing device according to claim 6, wherein the operations further comprise:

performing the correction by adding a predetermined correction value to the payload length, and changing the correction value in a case where the second protocol error is detected.

13. The information processing device according to claim 7, wherein the correction is performed by adding a predetermined correction value to the payload length, and the payload length is corrected with a plurality of the correction values that is different, and the correction with a correction value with which the first protocol error and the second protocol error are not detected is validated.

14. The information processing device according to claim 1, wherein the correction is performed by adding a predetermined correction value to the payload length, and the payload length is corrected with a plurality of the correction values that is different, and the correction with a correction value with which the first protocol error is not detected is validated.

15. The information processing device according to claim 6, wherein the correction is performed by adding a predetermined correction value to the payload length, and the payload length is corrected with a plurality of the correction values that is different, and the correction with a correction value with which the second protocol error is not detected is validated.

16. An information processing device comprising:

a memory storing instructions, and at least one processor configured to execute the instructions to perform operations comprising:

performing correction on a payload length obtained on a basis of data of headers of second packets included in a first packet;

calculating a packet length of the second packets by using a header length of the headers of the second packets and the payload length after performing the correction; and extracting the second packet stored in the first packet from the first packet on a basis of a head position of the second packet specified by the packet length of the second packet.

17. A non-transitory computer readable medium storing a program, the program being executable by a processor to perform operations comprising:

performing correction on a payload length obtained on a basis of data of headers of second packets included in a first packet;

calculating a packet length of the second packets by using a header length of the headers of the second packets and the payload length after performing the correction; and detecting a first protocol error based on a difference between a head position of the second packet at a head specified by data of a header of the first packet and the head position of the second packet at the head specified by the packet length of the second packet immediately before the second packet at the head, among the second packets included in the first packet.

* * * * *